United States Patent
Finck et al.

(10) Patent No.: US 12,040,789 B2
(45) Date of Patent: Jul. 16, 2024

(54) MITIGATING STRAY-COUPLING VIA MULTI-JUNCTION QUBITS

(71) Applicant: International Business Machines Corporation, Armonk, NY (US)

(72) Inventors: Aaron Finck, White Plains, NY (US); Jiri Stehlik, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 139 days.

(21) Appl. No.: 17/816,058

(22) Filed: Jul. 29, 2022

(65) Prior Publication Data

US 2024/0039532 A1    Feb. 1, 2024

(51) Int. Cl.
*H03K 17/92*        (2006.01)
*G06N 10/40*        (2022.01)
*H10N 69/00*        (2023.01)

(52) U.S. Cl.
CPC ............. *H03K 17/92* (2013.01); *G06N 10/40* (2022.01); *H10N 69/00* (2023.02)

(58) Field of Classification Search
CPC .................................................... H03K 17/92
USPC ......................................................... 327/528
See application file for complete search history.

(56) References Cited

U.S. PATENT DOCUMENTS 9,685,935 B2    6/2017    Strand et al.
10,467,544 B2   11/2019   Filipp et al.
2020/0320426 A1* 10/2020  Amin ................... H10N 60/805
2021/0384404 A1  12/2021  Fink et al.
2021/0408112 A1  12/2021  Fink et al.

OTHER PUBLICATIONS

International Search Report and Written Opinion received for PCT Application Serial No. PCT/EP2023/070503 dated Oct. 30, 2023, 9 pages.
Zhao et al., Switchable next-nearest-neighbor coupling for controlled two-qubit operations, https://arxiv.org/abs/2004.08639v2, Oct. 14, 2020, 17 pages.
Xu et al., High-fidelity, high-scalability two-qubit gate scheme for superconducting qubits, arXiv:2006.11860v2 [quant-ph], Dec. 22, 2020, 14 pages.
Yanay et al., Mediated interactions beyond the nearest neighbor in an array of superconducting qubits, https://arxiv.org/pdf/2110.01699.pdf, Nov. 8, 2021, 10 pages.
Stehlik et al., Tunable Coupling Architecture for Fixed-frequency Transmons, https://arxiv.org/abs/2101.07746, Jan. 19, 2021, 7 pages.

(Continued)

*Primary Examiner* — Tomi Skibinski
(74) *Attorney, Agent, or Firm* — Amin, Turocy & Watson, LLP

(57) ABSTRACT

Systems and techniques that facilitate mitigating stray-coupling via multi junction qubits are provided. In various embodiments, a device can comprise a first qubit having a plurality of Josephson junctions respectively between a plurality of capacitor pads. In various aspects, the device can further comprise a plurality of second qubits respectively coupled to different ones of the plurality of capacitor pads, such that no two of the plurality of second qubits can be coupled to a same one of the plurality of capacitor pads.

20 Claims, 7 Drawing Sheets

(56) References Cited

OTHER PUBLICATIONS

U.S. Application for "Quantum Logic Circuit Qubit Layout" U.S. Appl. No. 17/536,706, filed Nov. 29, 2021, 49 pages.
U.S. Application for "Mitigating Cross-Talk in a Flux Tunable Coupler Architecture" U.S. Appl. No. 17/203,691, filed Mar. 16, 2021, 39 pages.

* cited by examiner

MITIGATING STRAY-COUPLING VIA MULTI-JUNCTION QUBITS

BACKGROUND

The subject disclosure relates to qubits, and more specifically to mitigating stray-coupling via multi junction qubits.

Quantum computing is facilitated by performing quantum circuits on qubits that are arranged within a qubit lattice. The types/content of quantum circuits that can be performed depend upon which qubits are coupled to each other within the qubit lattice. Higher-order coupling topologies among the qubits in the qubit lattice enable more interesting/useful quantum circuits to be performed. However, such higher-order coupling topologies also cause significant stray-coupling to occur, which can be undesirable.

Accordingly, systems and/or techniques that can address one or more of these technical problems can be desirable.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus, and/or computer program products that can facilitate mitigating stray-coupling via multi junction qubits are described.

According to one or more embodiments, a device is provided. In various aspects, the device can comprise a first qubit having a plurality of Josephson junctions respectively between a plurality of capacitor pads. In various aspects, the device can further comprise a plurality of second qubits respectively coupled to different ones of the plurality of capacitor pads, such that no two of the plurality of second qubits are coupled to a same one of the plurality of capacitor pads. In various instances, the device can further comprise a plurality of inductive loops respectively between the plurality of capacitor pads, and a plurality of third qubits respectively coupled to different ones of the plurality of inductive loops, such that no two of the plurality of third qubits are coupled to a same one of the plurality of inductive loops. In various cases, different ones of the plurality of Josephson junctions can be differently sized.

According to one or more embodiments, a system is provided. In various embodiments, the system can comprise a qubit lattice. In various aspects, the system can further comprise at least one qubit within the qubit lattice that is coupled to three or more neighboring qubits within the qubit lattice. In various instances, the at least one qubit can have three or more coupling elements that respectively correspond to the three or more neighboring qubits. In various cases, no two of the three or more neighboring qubits can be coupled to a same one of the three or more coupling elements. In various aspects, a coupling element can be a capacitor pad or an inductive loop. In various instances, the qubit lattice can exhibit a heavy-hex tiling layout.

In various embodiments, the above-described device and/or system can be implemented as methods.

Various other details of various embodiments described herein are provided in the following clauses:

CLAUSE 1: A device, comprising: a first qubit having a plurality of Josephson junctions respectively between a plurality of capacitor pads; and a plurality of second qubits respectively coupled to different ones of the plurality of capacitor pads. As described herein, when the plurality of second qubits are respectively coupled to different ones of the plurality of capacitor pads, there can be no and/or otherwise ameliorated levels of stray-coupling (e.g., cross-talk) between respective pairs of the plurality of second qubits.

CLAUSE 2: The device of any preceding clause specified in the Summary, wherein no two of the plurality of second qubits are coupled to a same one of the plurality of capacitor pads. Again, as described herein, this can eliminate and/or otherwise reduce stray-coupling between the plurality of second qubits.

CLAUSE 3: The device of any preceding clause specified in the Summary, further comprising: a plurality of inductive loops respectively between the plurality of capacitor pads; and a plurality of third qubits respectively coupled to different ones of the plurality of inductive loops. As described herein, when the plurality of third qubits are respectively coupled to different ones of the plurality of inductive loops, there can be no and/or otherwise ameliorated levels of stray-coupling (e.g., cross-talk) between respective pairs of the plurality of third qubits.

CLAUSE 4: The device of any preceding clause specified in the Summary, wherein no two of the plurality of third qubits are coupled to a same one of the plurality of inductive loops. Again, as described herein, this can eliminate and/or otherwise reduce stray-coupling between the plurality of third qubits.

CLAUSE 5: The device of any preceding clause specified in the Summary, wherein the first qubit includes a first Josephson junction between a first capacitor pad and a second capacitor pad, and wherein the first qubit further includes a second Josephson junction between the second capacitor pad and a third capacitor pad.

CLAUSE 6: The device of any preceding clause specified in the Summary, wherein the plurality of second qubits includes a first transmon qubit that is coupled to the first capacitor pad and that is coupled to neither the second capacitor pad nor the third capacitor pad, a second transmon qubit that is coupled to the second capacitor pad and that is coupled to neither the first capacitor pad nor the third capacitor pad, and a third transmon qubit that is coupled to the third capacitor pad and that is coupled to neither the first capacitor pad nor the second capacitor pad.

CLAUSE 7: The device of any preceding clause specified in the Summary, wherein the plurality of second qubits are respectively coupled to the different ones of the plurality of capacitor pads by flux-tunable couplers.

CLAUSE 8: The device of any preceding clause specified in the Summary, wherein different ones of the plurality of Josephson junctions are differently sized. As described herein, such different (e.g., asymmetric) sizing of the plurality of Josephson junctions can cause different modes of operation to be implemented, as compared to same (e.g., symmetric) sizing of the plurality of Josephson junctions.

In various aspects, any combination and/or combinations of any of clauses 1-8 can be implemented.

CLAUSE 9: A method, comprising: providing a first qubit that has a plurality of Josephson junctions respectively between a plurality of capacitor pads; and respectively coupling a plurality of second qubits to different ones of the plurality of capacitor pads. As described herein, when the plurality of second qubits are respectively coupled to different ones of the plurality of capacitor pads, there can be no and/or otherwise ameliorated levels of stray-coupling (e.g., cross-talk) between respective pairs of the plurality of second qubits.

CLAUSE 10: The method of any preceding clause specified in the Summary, wherein no two of the plurality of second qubits are coupled to a same one of the plurality of capacitor pads. Again, as described herein, this can eliminate and/or otherwise reduce stray-coupling between the plurality of second qubits.

CLAUSE 11: The method of any preceding clause specified in the Summary, wherein a plurality of inductive loops are respectively between the plurality of capacitor pads, and further comprising: respectively coupling a plurality of third qubits to different ones of the plurality of inductive loops. As described herein, when the plurality of third qubits are respectively coupled to different ones of the plurality of inductive loops, there can be no and/or otherwise ameliorated levels of stray-coupling (e.g., cross-talk) between respective pairs of the plurality of third qubits.

CLAUSE 12: The method of any preceding clause specified in the Summary, wherein no two of the plurality of third qubits are coupled to a same one of the plurality of inductive loops. Again, as described herein, this can eliminate and/or otherwise reduce stray-coupling between the plurality of third qubits.

CLAUSE 13: The method of any preceding clause specified in the Summary, wherein the first qubit includes a first Josephson junction between a first capacitor pad and a second capacitor pad, and wherein the first qubit further includes a second Josephson junction between the second capacitor pad and a third capacitor pad.

CLAUSE 14: The method of any preceding clause specified in the Summary, wherein the plurality of second qubits includes a first transmon qubit that is coupled to the first capacitor pad and that is coupled to neither the second capacitor pad nor the third capacitor pad, a second transmon qubit that is coupled to the second capacitor pad and that is coupled to neither the first capacitor pad nor the third capacitor pad, and a third transmon qubit that is coupled to the third capacitor pad and that is coupled to neither the first capacitor pad nor the second capacitor pad.

CLAUSE 15: The method of any preceding clause specified in the Summary, wherein the plurality of second qubits are respectively coupled to the different ones of the plurality of capacitor pads by flux-tunable couplers.

CLAUSE 16: The method of any preceding clause specified in the Summary, wherein different ones of the plurality of Josephson junctions are differently sized. As described herein, such different (e.g., asymmetric) sizing of the plurality of Josephson junctions can cause different modes of operation to be implemented, as compared to same (e.g., symmetric) sizing of the plurality of Josephson junctions.

In various aspects, any combination and/or combinations of any of clauses 9-16 can be implemented.

CLAUSE 17: A system, comprising: a qubit lattice; and at least one qubit within the qubit lattice that is coupled to three or more neighboring qubits within the qubit lattice, wherein the at least one qubit has three or more coupling elements that respectively correspond to the three or more neighboring qubits, wherein no two of the three or more neighboring qubits are coupled to a same one of the three or more coupling elements, and wherein a coupling element is a capacitor pad or an inductive loop. As described herein, when no two of the three or more neighboring qubits are coupled to a same one of the three or more coupling elements, there can be no and/or otherwise ameliorated levels of stray-coupling (e.g., cross-talk) between respective pairs of the three or more neighboring qubits.

CLAUSE 18: The system of any preceding clause specified in the Summary, wherein the at least one qubit is coupled to three neighboring qubits, wherein the at least one qubit has two Josephson junctions in series between three capacitor pads, and wherein the three neighboring qubits are respectively coupled to different ones of the three capacitor pads.

CLAUSE 19: The system of any preceding clause specified in the Summary, wherein the at least one qubit is coupled to five neighboring qubits, wherein the at least one qubit has two Josephson junctions in series between three capacitor pads and two inductive loops, and wherein the five neighboring qubits are respectively coupled to different ones of the three capacitor pads and the two inductive loops. As described herein, such embodiments can significantly increase the number of neighboring qubits which can be coupled to any given qubit, without experiencing an excessive increase in stray-coupling between such neighboring qubits.

CLAUSE 20: The system of any preceding clause specified in the Summary, wherein the qubit lattice exhibits a heavy-hex tiling layout.

In various aspects, any combination and/or combinations of any of clauses 17-20 can be implemented.

DETAILED DESCRIPTION

Figure 1:
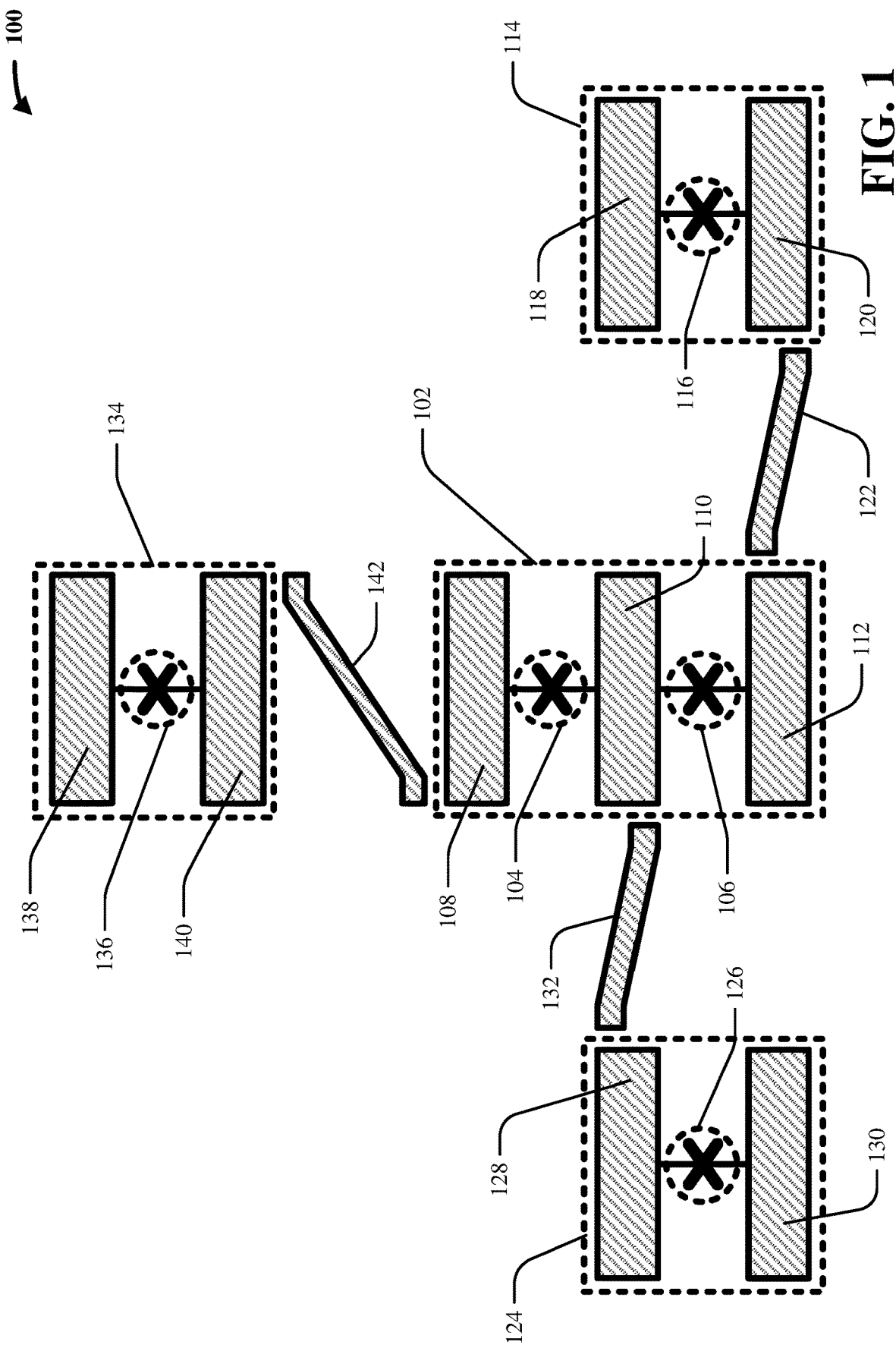
FIG. 1 illustrates a structural diagram of an example, non-limiting system that facilitates mitigating stray-coupling via multi junction qubits in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computing can be facilitated by performing quantum circuits (e.g., sequences of parallel and/or serial quantum gates, such as Pauli-X gates, Pauli-Y gates, Pauli-Z gates, Phase gates, Controlled Not gates, and/or Controlled Phase gates) on qubits (e.g., superconducting qubits, such as transmon qubits) that are arranged within a qubit lattice. The types/content of quantum circuits that can be performed on the qubit lattice can depend upon which qubits are coupled to each other within the qubit lattice. For example, an entangling gate (e.g., a Controlled Not gate, a Controlled Phase gate) can be performed only on two qubits that are coupled together and cannot be performed on any two qubits that are not coupled together. In this way, the quantum circuits that are implementable on the qubit lattice can be restricted by the coupling topology of the qubit lattice.

Higher-order coupling topologies among the qubits in the qubit lattice can enable more interesting and/or more useful quantum circuits to be performed on the qubit lattice. In other words, it can be desirable to couple more qubits within the qubit lattice to each other. However, such higher-order coupling topologies have the negative side-effect of causing significant amounts of stray-coupling (e.g., spectator crosstalk) to occur. Existing techniques offer no solution to such heightened levels of stray-coupling, other than to altogether eschew higher-order coupling topologies and the more interesting/useful quantum circuits supported by such topologies.

Accordingly, systems and/or techniques that can address one or more of these technical problems can be desirable.

Various embodiments described herein can address one or more of these technical problems. In particular, various embodiments described herein can provide systems and/or techniques that can facilitate mitigation of stray-coupling via multi junction qubits. More specifically, the inventors of various embodiments described herein determined how/why higher-order coupling topologies cause increased levels of stray-coupling and further devised a technique that can utilize multi junction qubits to reduce and/or otherwise ameliorate stray-coupling in such higher-order coupling topologies. More specifically still, the present inventors realized that heightened stray-coupling plagues existing techniques because, whenever three or more neighboring qubits are coupled to a given qubit in accordance with such existing techniques, some of such three or more neighboring qubits are coupled to a same coupling element (e.g., to a same capacitor pad and/or to a same inductive loop) of the given qubit. In various aspects, the present inventors realized that such heightened stray-coupling can be avoided and/or otherwise reduced when the given qubit is a multi junction qubit, because such multi junction qubit can have more coupling elements (e.g., can have one coupling element per neighboring qubit), such that no two neighboring qubits are coupled to a same coupling element of the given qubit (e.g., such that no two neighboring qubits share a same coupling element of the given qubit).

As a non-limiting example, consider a qubit A, a qubit B, a qubit C, and a qubit D. In various cases, each of the qubit A, the qubit B, the qubit C, and the qubit D can be transmon qubits. In various aspects, a transmon qubit can be a superconducting qubit that is formed by a Josephson junction shunted by two capacitor pads (e.g., planar capacitor pads, trench capacitor pads, and/or any other suitable types of capacitor pads). In various instances, a transmon qubit can have a charging energy that is significantly smaller (e.g., one or more orders of magnitude smaller) than its Josephson energy. Accordingly, the qubit A can be considered as being made up of a Josephson junction A shunted by two capacitor pads: a capacitor pad $A_1$ and a capacitor pad $A_2$. Likewise, the qubit B can be considered as being made up of a Josephson junction B shunted by two capacitor pads: a capacitor pad $B_1$ and a capacitor pad $B_2$. Similarly, the qubit C can be considered as being made up of a Josephson junction C shunted by two capacitor pads: a capacitor pad $C_1$ and a capacitor pad $C_2$. Finally, the qubit D can be considered as being made up of a Josephson junction D shunted by two capacitor pads: a capacitor pad $D_1$ and a capacitor pad $D_2$.

In any case, suppose that it is desired to couple the qubit A to each of the qubit B, the qubit C, and the qubit D. In various aspects, this can be facilitated by directly and/or indirectly capacitively coupling (in fixed and/or in flux-tunable fashion) one of the two capacitor pads $A_1$ and $A_2$ to one of the two capacitor pads $B_1$ and $B_2$, by directly and/or indirectly capacitively coupling (in fixed and/or in flux-tunable fashion) one of the two capacitor pads $A_1$ and $A_2$ to one of the two capacitor pads $C_1$ and $C_2$, and by directly and/or indirectly capacitively coupling (in fixed and/or in flux-tunable fashion) one of the two capacitor pads $A_1$ and $A_2$ to one of the two capacitor pads $D_1$ and $D_2$.

Note that such configuration unavoidably causes one of the two capacitor pads $A_1$ and $A_2$ to be capacitively coupled to two different qubits, which can result in heightened stray-coupling (e.g., which can result in exacerbated spectator cross-talk) between those two different qubits. For instance, without loss of generality, one of the two capacitor pads $B_1$ and $B_2$ of the qubit B can be coupled to the capacitor pad $A_1$, and one of the two capacitor pads $C_1$ and $C_2$ of the qubit C can be coupled to the capacitor pad $A_2$. In such case, one of the two capacitor pads $D_1$ and $D_2$ of the qubit D can be coupled to either the capacitor pad $A_1$ or the capacitor pad $A_2$. If one of the two capacitor pads $D_1$ and $D_2$ of the qubit D is coupled to the capacitor pad $A_1$, then the capacitor pad $A_1$ can be considered as being coupled to both the qubit B and the qubit D, which can undesirably cause excessive cross-talk to occur between the qubit B and the qubit D. That is, when both the qubit B and the qubit D are coupled to the capacitor pad $A_1$, entangling gates that are configured to entangle the qubit A with the qubit B can inadvertently cause entangling interactions to occur between the qubit B and the qubit D. Similarly, when both the qubit B and the qubit D are coupled to the capacitor pad $A_1$, entangling gates that are configured to entangle the qubit A with the qubit D can inadvertently cause entangling interactions to occur between the qubit B and the qubit D.

On the other hand, if one of the two capacitor pads $D_1$ and $D_2$ of the qubit D is coupled to the capacitor pad $A_2$, then the capacitor pad $A_2$ can be considered as being coupled to both the qubit C and the qubit D, which can undesirably cause excessive cross-talk to occur between the qubit C and the qubit D. That is, when both the qubit C and the qubit D are coupled to the capacitor pad $A_2$, entangling gates that are configured to entangle the qubit A with the qubit C can inadvertently cause entangling interactions to occur between the qubit C and the qubit D. Likewise, when both the qubit C and the qubit D are coupled to the capacitor pad $A_2$, entangling gates that are configured to entangle the qubit A with the qubit D can inadvertently cause entangling interactions to occur between the qubit C and the qubit D.

Therefore, when it is desired to couple a transmon qubit to three or more other transmon qubits in accordance with existing techniques, heightened stray-coupling can be inevitable. Indeed, as the present inventors realized, this can be due to the fact that a transmon qubit has only two coupling elements (e.g., two capacitor pads), and so coupling three or more neighbors to the transmon qubit necessarily forces some of those three or more neighbors to be coupled to a same one of those two coupling elements. Stated differently, when existing techniques are implemented, such heightened stray-coupling can be avoided and/or mitigated only by implementing a ring-topology in which no more than two transmon qubits are coupled to any given transmon qubit. That is, since a transmon qubit has only two coupling elements (e.g., two capacitor pads), coupling two or fewer neighbors to the transmon qubit allows each of those two or fewer neighbors to be coupled to its own corresponding one of those two coupling elements. Unfortunately, very many quantum circuits of interest cannot be implemented on such a ring-topology.

The present inventors realized that this significant technical problem can be avoided, mitigated, and/or otherwise ameliorated by leveraging multi junction qubits, since such multi junction qubits can have higher numbers of coupling elements (e.g., higher numbers of capacitor pads). A non-limiting example of a multi junction qubit can be a two-junction transmon qubit. In various aspects, a two-junction transmon qubit can be a superconducting qubit that includes two capacitively-shunted Josephson junctions that are coupled in series (e.g., a two-junction transmon qubit can be formed by two single junction transmon qubits connected and/or coupled in series). In other words, a two-junction transmon qubit can include a first Josephson junction and a second Josephson junction, where the first Josephson junction is serially coupled between a first capacitor pad and a second capacitor pad, and where the second Josephson junction is serially coupled between the second capacitor pad and a third capacitor pad. In various aspects, the second capacitor pad can be called a middle capacitor pad of the two-junction transmon qubit, and the first capacitor pad and the third capacitor pad can be called end capacitor pads of the two-junction transmon qubit. In various cases, a two-junction transmon qubit can also be referred to as a tunable coupler qubit.

In various instances, a two-junction transmon qubit can support and/or exhibit two distinct excitation modes: a dark mode and a bright mode. In various aspects, these two distinct excitation modes can have two different spatial symmetries and/or two different transition frequencies (e.g., a dark mode transition frequency and a bright transition frequency). More specifically, the dark mode of a two-junction transmon qubit can be a higher frequency excitation mode that has no net dipole moment. In other words, the dark mode can refrain from coupling to global electric fields. In contrast, the bright mode of a two-junction transmon qubit can be a lower frequency excitation mode that has a net dipole moment. That is, the bright mode can couple to global electric fields. In various instances, a two-junction transmon qubit can be encoded in either the dark mode (and can thus have a dark mode transition frequency) or the bright mode (and can thus have a bright mode transition frequency). In various aspects, short microwave pulses can be used to switch a two-junction transmon qubit between encodings (e.g., a suitable microwave pulse can be applied to a two-junction transmon qubit to switch the two-junction transmon qubit from the dark mode to the bright mode and/or from the bright mode to the dark mode).

In any case, the present inventors realized that implementation of a two-junction transmon qubit in a qubit lattice can help to mitigate and/or reduce stray-coupling. Consider again the above non-limiting example, in which it is desired to couple the qubit A to each of the qubit B, the qubit C, and the qubit D. As mentioned above, the qubit B, the qubit C, and the qubit D can all be transmon qubits. As further explained above, when the qubit A is also a transmon qubit, excessive stray-coupling can occur, since one of the capacitor pads of the qubit A is forced to be coupled to at least two other qubits. However, as the present inventors realized, this problem can be avoided and/or reduced when the qubit A is a two-junction transmon qubit. That is, suppose that the qubit A has a first Josephson junction between a capacitor pad $A_1$ and a capacitor pad $A_2$, and further suppose that the qubit A has a second Josephson junction between the capacitor pad $A_2$ and a capacitor pad $A_3$. In other words, the qubit A can be considered as having three capacitor pads, instead of merely two capacitor pads. Now, without loss of generality, one of the two capacitor pads $B_1$ and $B_2$ of the qubit B can be coupled to the capacitor pad $A_1$, one of the two capacitor pads $C_1$ and $C_2$ of the qubit C can be coupled to the capacitor pad $A_2$, and one of the two capacitor pads $D_1$ and $D_2$ of the qubit D can be coupled to the capacitor pad $A_3$. Note that, in such configuration, none of the three capacitor pads of the qubit A need be coupled to more than one of the qubit B, the qubit C, and the qubit D. In other words, none of the qubit B, the qubit C, and the qubit D need be coupled to a same capacitor pad (e.g., to a same coupling element) of the qubit A. Thus, such configuration in which the qubit A is a two-junction transmon can experience significantly reduced stray-coupling (e.g., significantly reduced spectator cross-talk), as compared to a configuration in which the qubit A is a single-junction transmon.

Furthermore, because a two-junction transmon can exhibit different modes of excitation as mentioned above, the qubit A can exhibit such different modes of excitation when the qubit A is a two-junction transmon: a bright mode and a dark mode. In various aspects, such different modes of excitation can be leveraged and/or utilized depending upon the relative sizes of the two Josephson junctions of the qubit A. As a non-limiting example, suppose that the first Josephson junction and the second Josephson junction of the qubit A are symmetrically sized (e.g., have the same dimensions as each other). In such case, the configuration described above in which the qubit B is coupled to the capacitor pad $A_1$, the qubit C is coupled to the capacitor pad $A_2$, and the qubit D is coupled to the capacitor pad $A_3$ can be considered as causing the qubit B, the qubit C, and the qubit D to all be coupled to the dark mode of the qubit A. In contrast and as another non-limiting example, suppose that the first Josephson junction and the second Josephson junction of the qubit A are asymmetrically sized (e.g., one junction can be twice as large as the other). In such case, the configuration described above in which the qubit B is coupled to the capacitor pad $A_1$, the qubit C is coupled to the capacitor pad $A_2$, and the qubit D is coupled to the capacitor pad $A_3$ can be considered as causing the qubit B, the qubit C, and the qubit D to all be coupled to the bright mode of the qubit A. In various cases, coupling to the bright mode in this way can be beneficial, since the anharmonicity of the bright mode can be larger in the asymmetric case than in the symmetric case (e.g., a larger anharmonicity can help to avoid frequency collisions).

In any case, and as the above non-limiting examples help to illustrate, the present inventors realized that existing techniques cause excessive stray-coupling to occur in higher-order coupling topologies precisely because, whenever a qubit is coupled to three or more neighbors, such existing techniques force some of those three or more neighbors to be coupled to a same coupling element (e.g., to a same capacitor pad) of the qubit. Furthermore, the present inventors realized that such excessive stray-coupling can be mitigated, whenever a qubit is coupled to three or more neighbors, by configuring that qubit as a multi junction qubit (e.g., as a two-junction transmon). After all, a multi junction qubit can have more coupling elements (e.g., more capacitor pads), which can help to ensure that each neighbor is coupled to its own corresponding coupling element (e.g., which can help to ensure that no two neighbors are coupled to a same coupling element as each other). When each neighbor is coupled to its own corresponding coupling element (e.g., when no two neighbors are coupled to a same coupling element as each other), spectator cross-talk between the neighbors can be reduced.

Although the herein disclosure mainly describes various embodiments of a coupling element of a qubit as being a capacitor pad, this is a mere non-limiting example of ease of explanation. In various aspects, a coupling element of a qubit can be any other suitable circuit structure and/or circuit component of a qubit to which other qubits (e.g., neighboring qubits) can be coupled. As a non-limiting example, a qubit can be fabricated not just with one or more capacitor pads, but also with one or more inductive loops. In such case, the one or more capacitor pads and the one or more inductive loops can all be considered and/or otherwise referred to as coupling elements of the qubit. After all, neighbors can be directly and/or indirectly capacitively coupled to the one or more capacitor pads of the qubit, and/or neighbors can be directly and/or indirectly inductively coupled to the one or more inductive loops of the qubit.

In any case, the present inventors realized that stray-coupling within higher-order coupling topologies can be mitigated and/or otherwise reduced by implementing multi junction qubits, because such multi junction qubits can include larger numbers of coupling elements (e.g., can include more capacitor pads, and/or more inductive loops) as compared to single junction qubits, and because such larger numbers of coupling elements can help to ensure that no two neighbors are coupled to a same coupling element as each other.

Various embodiments described herein can be employed to use hardware and/or software to solve problems that are highly technical in nature (e.g., to facilitate mitigation of stray-coupling via multi junction qubits), that are not abstract, that are not mere laws of nature, that are not mere natural phenomena, and that cannot be performed as a set of mental acts by a human. Instead, various embodiments described herein include tangible electric circuit structures/architectures and/or methodologies pertaining to such tangible electric circuit structures/architectures that can be implemented so as to reduce stray-coupling in a qubit lattice. Indeed, as mentioned above, whenever three or more neighboring qubits are coupled to a given qubit according to existing techniques, the present inventors realized that heightened stray-coupling (e.g., heightened spectator cross-talk) occurs because such existing techniques involve some of those three or more neighbors being coupled to a same coupling element (e.g., to a same capacitor pad, to a same inductive loop) of the given qubit.

In contrast, various embodiments described herein can address such technical problems. Specifically, systems/techniques described herein can reduce stray-coupling by implementing multi junction qubits. In particular, the present inventors realized that, whenever three or more neighboring qubits are coupled to a given qubit, stray-coupling can be significantly reduced when the given qubit is a multi junction qubit (e.g., a two-junction transmon). Indeed, when the given qubit is a multi junction qubit, the given qubit can have a higher number of coupling elements (e.g., can have more capacitor pads and/or inductive loops) than would be possible if the given qubit were instead a single-junction qubit. Accordingly, when the given qubit has a higher number of coupling elements, it can be possible to prevent any two neighbors from being coupled to the same coupling element of the given qubit (e.g., the total number of coupling elements of the given qubit can be greater than or equal to the total number of neighbors that are desired to be coupled to the given qubit). Thus, when no two neighbors are coupled to the same coupling element of the given qubit (e.g., when no two neighbors are coupled to the same capacitor pad of the given qubit, and/or when no two neighbors are coupled to the same inductive loop of the given qubit), stray-coupling (e.g., spectator cross-talk) between the neighbors can be ameliorated. Because various embodiments described herein can mitigate these technical problems (e.g., excessive stray-coupling) associated with existing techniques, such embodiments certainly constitute a concrete and tangible technical improvement in the field of qubits.

Furthermore, various embodiments described herein can control tangible, hardware-based, and/or software-based devices based on the disclosed teachings. For example, embodiments described herein can include tangible qubits (e.g., superconducting qubits made up of Josephson junctions, capacitor pads, and/or inductive loops) that can be fabricated on tangible quantum substrates (e.g., silicon wafers).

It should be appreciated that the figures and the herein disclosure describe non-limiting examples of various embodiments. It should further be appreciated that the figures are not necessarily drawn to scale.

FIG. 1 illustrates a structural diagram of an example, non-limiting system 100 that can facilitate mitigating stray-coupling via multi junction qubits in accordance with one or more embodiments described herein. As shown, the system 100 can include a multi junction qubit 102.

In various embodiments, the multi junction qubit 102 can comprise a Josephson junction 104, a Josephson junction 106, a capacitor pad 108, a capacitor pad 110, and/or a capacitor pad 112. In various aspects, as shown, the Josephson junction 104 can be coupled to the capacitor pad 108 and to the capacitor pad 110, such that the capacitor pad 108, the Josephson junction 104, and the capacitor pad 110 can be considered as all being in series with each other. Accordingly, in various instances, the capacitor pad 108 and the capacitor pad 110 can collectively be considered as forming a capacitance that shunts the Josephson junction 104.

Similarly, in various cases, as shown, the Josephson junction 106 can be coupled to the capacitor pad 110 and to the capacitor pad 112, such that the capacitor pad 110, the Josephson junction 106, and the capacitor pad 112 can be considered as all being in series with each other. Thus, in various aspects, the capacitor pad 110 and the capacitor pad 112 can collectively be considered as forming a capacitance that shunts the Josephson junction 106.

Moreover, in various instances, as shown, the capacitor pad 108, the Josephson junction 104, the capacitor pad 110, the Josephson junction 106, and the capacitor pad 112 can all be considered as being in series with each other. Accordingly, in various cases, the capacitor pad 108 and the capacitor pad 112 can be considered as collectively forming a capacitance that shunts both the Josephson junction 104 and the Josephson junction 106.

Accordingly, in various aspects, the multi junction qubit 102 can be considered as a two-junction transmon formed by two serially-coupled single-junction transmons. In particular, the capacitor pad 108, the Josephson junction 104, and the capacitor pad 110 can collectively be considered as forming a first single-junction transmon. Likewise, the capacitor pad 110, the Josephson junction 106, and the capacitor pad 112 can collectively be considered as forming a second single-junction transmon that is in series with the first single-junction transmon. As can be seen, the first single-junction transmon and the second single-junction transmon can be considered as sharing the capacitor pad 110. Accordingly, in various instances, the capacitor pad 110 can be referred to as a middle pad of the multi junction qubit 102, and/or the capacitor pad 108 and the capacitor pad 112 can be referred to as end pads of the multi-junction qubit 102. In any case, because the multi junction qubit 102 can be considered as a two-junction transmon in the non-limiting example of FIG. 1, the multi junction qubit 102 can be considered as having multiple modes of excitation (e.g., a dark mode and a bright mode).

In various cases, the capacitor pad 108, the Josephson junction 104, the capacitor pad 110, the Josephson junction 106, and/or the capacitor pad 112 can be fabricated and/or manufactured via any suitable microfabrication and/or nanofabrication techniques (e.g., photolithography, deposition, etching, double-angle evaporation) on any suitable quantum substrate (e.g., silicon wafer, not shown). In various instances, the capacitor pad 108, the Josephson junction 104, the capacitor pad 110, the Josephson junction 106, and/or the capacitor pad 112 can be fabricated and/or manufactured from any suitable superconducting materials and/or combinations of superconducting materials as desired.

Although FIG. 1 depicts the Josephson junction 104 and the Josephson junction 106 as being identical to each other (e.g., as being identically-sized and/or as being identically-structured), this is a mere non-limiting example for ease of illustration and/or explanation. In various aspects, the Josephson junction 104 and the Josephson junction 106 can, in various aspects, have the same and/or different sizes, shapes, spatial dimensions, and/or material compositions as each other.

Similarly, although FIG. 1 depicts the capacitor pad 108, the capacitor pad 110, and the capacitor pad 112 as being identical to each other (e.g., as being identically-sized and/or identically-structured), this is a mere non-limiting example for ease of illustration. Indeed, in various instances, the capacitor pad 108, the capacitor pad 110, and the capacitor pad 112 can have the same and/or different sizes, shapes, spatial dimensions, and/or material compositions as each other.

In various embodiments, as shown, there can be a qubit 114. In various aspects, the qubit 114 can comprise a Josephson junction 116, a capacitor pad 118, and/or a capacitor pad 120. In various instances, as shown, the Josephson junction 116 can be coupled to the capacitor pad 118 and to the capacitor pad 120, such that the capacitor pad 118, the Josephson junction 116, and the capacitor pad 120 can be considered as all being in series with each other. Accordingly, in various cases, the capacitor pad 118 and the capacitor pad 120 can collectively be considered as forming a capacitance that shunts the Josephson junction 116. Therefore, in various aspects, the qubit 114 can be considered as a single-junction transmon.

In various aspects, any suitable microfabrication and/or nanofabrication techniques can be implemented to manufacture the capacitor pad 118, the Josephson junction 116, and/or the capacitor pad 120.

Although FIG. 1 depicts the Josephson junction 116 as being identical to the Josephson junctions of the multi junction qubit 102, this is a mere non-limiting example for ease of illustration and/or explanation. In various instances, the Josephson junction 116 can, in various aspects, have the same and/or different sizes, shapes, spatial dimensions, and/or material compositions as the Josephson junctions of the multi junction qubit 102.

Likewise, although FIG. 1 depicts the capacitor pad 118 and the capacitor pad 120 as being identical to each other and/or as being identical to the capacitor pads of the multi-junction qubit 102, this is a mere non-limiting example for ease of illustration. Indeed, in various aspects, the capacitor pad 118 and/or the capacitor pad 120 can have the same and/or different sizes, shapes, spatial dimensions, and/or material compositions as each other and/or as the capacitor pads of the multi junction qubit 102.

In various instances, as shown, the multi junction qubit 102 can be coupled to the qubit 114 by a direct capacitive coupler 122. In particular, the direct capacitive coupler 122 can be any suitable wire, cable, and/or circuit structure that can be in spatial proximity to the capacitor pad 112 of the multi junction qubit 102 and that can be in spatial proximity to the capacitor pad 120 of the qubit 114. Because the direct capacitive coupler 122 can be in spatial proximity to both the capacitor pad 112 and the capacitor pad 120, the direct capacitive coupler 122 can be considered as forming a capacitance between the capacitor pad 112 and the capacitor pad 120. In other words, the direct capacitive coupler 122 can be considered as capacitively coupling the capacitor pad 112 to the capacitor pad 120.

In various cases, the direct capacitive coupler 122 can be manufactured via any suitable microfabrication and/or nanofabrication techniques. In various instances, the direct capacitive coupler 122 can have any suitable size, shape, spatial dimensions, and/or material composition (e.g., can be made up of any suitable superconducting materials).

Although FIG. 1 depicts the capacitor pad 112 as being capacitively coupled to the capacitor pad 120 by the direct capacitive coupler 122, this is a mere non-limiting example for ease of illustration and/or explanation. In various aspects, any other suitable capacitive coupler (e.g., an indirect capacitive coupler), whether fixed or flux-tunable, can be implemented in place of and/or in addition to the direct capacitive coupler 122.

In various embodiments, as shown, there can be a qubit 124. In various aspects, the qubit 124 can comprise a Josephson junction 126, a capacitor pad 128, and/or a capacitor pad 130. In various instances, as shown, the Josephson junction 126 can be coupled to the capacitor pad 128 and to the capacitor pad 130, such that the capacitor pad 128, the Josephson junction 126, and the capacitor pad 130 can be considered as all being in series with each other. So, in various cases, the capacitor pad 128 and the capacitor pad 130 can collectively be considered as forming a capacitance that shunts the Josephson junction 126. Thus, in various aspects, the qubit 124 can be considered as a single-junction transmon.

Again, in various cases, any suitable microfabrication and/or nanofabrication techniques can be implemented to manufacture the capacitor pad 128, the Josephson junction 126, and/or the capacitor pad 130.

Although FIG. 1 depicts the Josephson junction 126 as being identical to the Josephson junctions of the multi junction qubit 102 and/or to the Josephson junction of the qubit 114, this is a mere non-limiting example for ease of illustration and/or explanation. In various aspects, the Josephson junction 126 can, in various aspects, have the same and/or different sizes, shapes, spatial dimensions, and/or material compositions as the Josephson junctions of the multi-junction qubit 102 and/or as the Josephson junction of the qubit 114.

Similarly, although FIG. 1 depicts the capacitor pad 128 and the capacitor pad 130 as being identical to each other, as being identical to the capacitor pads of the multi junction qubit 102, and/or as being identical to the capacitor pads of the qubit 114, this is a mere non-limiting example for ease of illustration. Indeed, in various cases, the capacitor pad 128 and/or the capacitor pad 130 can have the same and/or different sizes, shapes, spatial dimensions, and/or material compositions as each other, as the capacitor pads of the multi junction qubit 102, and/or as the capacitor pads of the qubit 114.

In various instances, as shown, the multi junction qubit 102 can be coupled to the qubit 124 by a direct capacitive coupler 132. In particular, the direct capacitive coupler 132 can be any suitable wire, cable, and/or circuit structure that can be in spatial proximity to the capacitor pad 110 of the multi junction qubit 102 and that can be in spatial proximity to the capacitor pad 128 of the qubit 124. Because the direct capacitive coupler 132 can be in spatial proximity to both the capacitor pad 110 and the capacitor pad 128, the direct capacitive coupler 132 can be considered as forming a capacitance between the capacitor pad 110 and the capacitor pad 128. That is, the direct capacitive coupler 132 can be considered as capacitively coupling the capacitor pad 110 to the capacitor pad 128 (e.g., as transmitting capacitive interactions between the capacitor pad 110 and the capacitor pad 128).

Just as above, in various aspects, the direct capacitive coupler 132 can be manufactured via any suitable microfabrication and/or nanofabrication techniques. In various instances, the direct capacitive coupler 132 can have any suitable size, shape, spatial dimensions, and/or material composition (e.g., can be made up of any suitable superconducting materials) as desired (e.g., can have the same and/or different sizes, shapes, dimensions, and/or compositions as the direct capacitive coupler 122).

Although FIG. 1 depicts the capacitor pad 110 as being capacitively coupled to the capacitor pad 128 by the direct capacitive coupler 132, this is a mere non-limiting example for ease of illustration and/or explanation. In various aspects, any other suitable capacitive coupler (e.g., an indirect capacitive coupler), whether fixed or flux-tunable, can be implemented in place of and/or in addition to the direct capacitive coupler 132.

In various embodiments, as shown, there can be a qubit 134. In various aspects, the qubit 134 can comprise a Josephson junction 136, a capacitor pad 138, and/or a capacitor pad 140. In various instances, as shown, the Josephson junction 136 can be coupled to the capacitor pad 138 and to the capacitor pad 140, such that the capacitor pad 138, the Josephson junction 136, and the capacitor pad 140 can be considered as all being in series with each other. Thus, in various cases, the capacitor pad 138 and the capacitor pad 140 can collectively be considered as forming a capacitance that shunts the Josephson junction 136. So, in various aspects, the qubit 134 can be considered as a single-junction transmon.

Once more, in various cases, any suitable microfabrication and/or nanofabrication techniques can be implemented to manufacture the capacitor pad 138, the Josephson junction 136, and/or the capacitor pad 140.

Although FIG. 1 depicts the Josephson junction 136 as being identical to the Josephson junctions of the multi junction qubit 102, to the Josephson junction of the qubit 114, and/or to the Josephson junction of the qubit 124, this is a mere non-limiting example for ease of illustration and/or explanation. In various aspects, the Josephson junction 136 can, in various aspects, have the same and/or different sizes, shapes, spatial dimensions, and/or material compositions as the Josephson junctions of the multi junction qubit 102, as the Josephson junction of the qubit 114, and/or as the Josephson junction of the qubit 124.

Likewise, although FIG. 1 depicts the capacitor pad 138 and the capacitor pad 140 as being identical to each other, as being identical to the capacitor pads of the multi junction qubit 102, as being identical to the capacitor pads of the qubit 124, and/or as being identical to the capacitor pads of the qubit 114, this is a mere non-limiting example for ease of illustration. Indeed, in various instances, the capacitor pad 138 and/or the capacitor pad 140 can have the same and/or different sizes, shapes, spatial dimensions, and/or material compositions as each other, as the capacitor pads of the multi junction qubit 102, as the capacitor pads of the qubit 114, and/or as the capacitor pads of the qubit 124.

In various instances, as shown, the multi junction qubit 102 can be coupled to the qubit 134 by a direct capacitive coupler 142. In particular, the direct capacitive coupler 142 can be any suitable wire, cable, and/or circuit structure that can be in spatial proximity to the capacitor pad 108 of the multi junction qubit 102 and that can be in spatial proximity to the capacitor pad 140 of the qubit 134. Because the direct capacitive coupler 142 can be in spatial proximity to both the capacitor pad 108 and the capacitor pad 140, the direct capacitive coupler 142 can be considered as forming a capacitance between the capacitor pad 108 and the capacitor pad 140. That is, the direct capacitive coupler 142 can be considered as capacitively coupling the capacitor pad 108 to the capacitor pad 140 (e.g., as transmitting capacitive interactions between the capacitor pad 108 and the capacitor pad 140).

Just as above, in various aspects, the direct capacitive coupler 142 can be manufactured via any suitable microfabrication and/or nanofabrication techniques. In various instances, the direct capacitive coupler 142 can have any suitable size, shape, spatial dimensions, and/or material composition (e.g., can be made up of any suitable superconducting materials) as desired (e.g., can have the same and/or different sizes, shapes, dimensions, and/or compositions as the direct capacitive coupler 122 and/or as the direct capacitive coupler 132).

Although FIG. 1 depicts the capacitor pad 108 as being capacitively coupled to the capacitor pad 140 by the direct capacitive coupler 142, this is a mere non-limiting example for ease of illustration and/or explanation. In various aspects, any other suitable capacitive coupler (e.g., an indirect capacitive coupler), whether fixed or flux-tunable, can be implemented in place of and/or in addition to the direct capacitive coupler 142.

In any case, as shown, the capacitor pads of the multi junction qubit 102 can be considered as being separately and/or independently coupled to three other qubits (e.g., 114, 124, and 134), such that no two of those three other qubits are coupled to a same capacitor pad as each other. More specifically, the qubit 114 can be considered as being coupled to the capacitor pad 112 and as being coupled to neither the capacitor pad 110 nor the capacitor pad 108. Likewise, the qubit 124 can be considered as being coupled to the capacitor pad 110 and as being coupled to neither the capacitor pad 112 nor the capacitor pad 108. Moreover, the qubit 134 can be considered as being coupled to the capacitor pad 108 and as being coupled to neither the capacitor pad 110 nor the capacitor pad 112. Accordingly, none of the qubit 114, the qubit 124, and the qubit 134 can be considered as being coupled to a same capacitor pad as each other. In other words, the qubit 114, the qubit 124, and the qubit 134 can all be considered as being coupled to different and/or respectively corresponding capacitor pads of the multi junction qubit 102. Therefore, there can be reduced, mitigated, and/or otherwise ameliorated levels of stray-coupling (e.g., spectator cross-talk) between the qubit 114 and the qubit 124, between the qubit 114 and the qubit 134, and/or between the qubit 124 and the qubit 134.

Note that such reduced, mitigated, and/or ameliorated stray-coupling would not be possible if the multi junction qubit 102 were instead a single-junction qubit. Indeed, if the multi-junction qubit 102 were instead a single-junction qubit (e.g., a single-junction transmon), then it would have merely two capacitor pads instead of three. In such case, at least two of the qubit 114, the qubit 124, and the qubit 134 would have to be coupled to a same capacitor pad as each other, which would increase stray-coupling.

Although FIG. 1 depicts the multi junction qubit 102 as being a two-junction transmon having three capacitor pads each of which is coupled to a different neighboring transmon, this is a mere non-limiting example for ease of illustration and/or explanation. In various embodiments, the multi junction qubit 102 can have three or more capacitor pads, so as to ensure that each neighboring qubit to which the multi junction qubit 102 is to be coupled can be allotted its own corresponding capacitor pad. For instance, if it is desired to couple the multi-junction qubit 102 to n neighboring qubits for any suitable positive integer n≥3, then the multi-junction qubit 102 can be structured/configured to have at least n capacitor pads (and can have any suitable number Josephson junctions in conjunction with such n capacitor pads), such that all n neighboring qubits can be coupled to the multi junction qubit 102 without any two of those n neighboring qubits being coupled to a same capacitor pad as each other.

As mentioned above, a two-junction transmon can exhibit a bright excitation mode and a dark excitation mode. Accordingly, because the multi junction qubit 102 can, in some cases, be a two-junction transmon, the multi junction qubit 102 can, in such cases, exhibit a bright excitation mode and a dark excitation mode. In some aspects, which of those two different excitation modes is implemented and/or activated can depend upon relative dimensions between the Josephson junction 104 and the Josephson junction 106. For example, suppose that the Josephson junction 104 and the Josephson junction 106 have the same and/or symmetric dimensions (e.g., as measured within any suitable threshold margin of error). In such case, the coupling configuration shown in FIG. 1 can cause all of the qubit 114, the qubit 124, and the qubit 134 to be coupled to the dark excitation mode of the multi junction qubit 102. As another example, suppose instead that the Josephson junction 104 and the Josephson junction 106 have different and/or asymmetric dimensions (e.g., as measured within any suitable threshold margin of error). For instance, without loss of generality, the Josephson junction 104 can be twice as large (e.g., twice as thick, twice of long, twice as wide) as the Josephson junction 106. In such case, the coupling configuration shown in FIG. 1 can cause all of the qubit 114, the qubit 124, and the qubit 134 to be coupled to the bright excitation mode of the multi junction qubit 102. In this way, relative size differences between the Josephson junction 104 and the Josephson junction 106 can influence and/or otherwise control which excitation mode is implemented (e.g., symmetric sizes can cause the dark mode to be implemented, whereas asymmetric sizes can cause the bright mode to be implemented).

In any case, as shown in FIG. 1, whenever it is desired to couple three or more neighboring transmons to a given qubit, stray-coupling can be reduced when that given qubit is a multi junction qubit having at least one unique capacitor pad per each of the three or more neighboring transmons.

Figure 2:
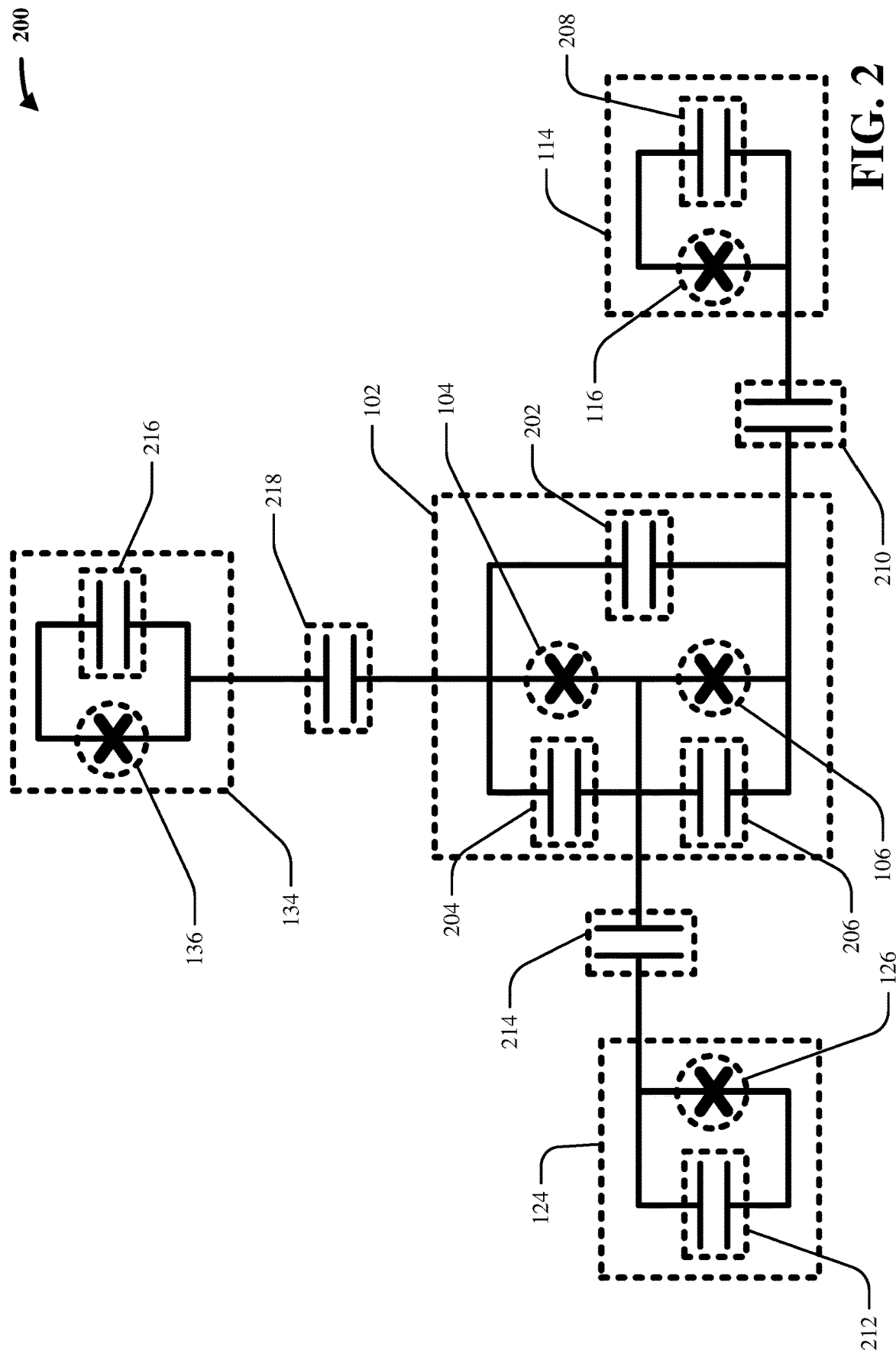
FIG. 2 illustrates a circuit diagram of an example, non-limiting system that facilitates mitigating stray-coupling via multi junction qubits in accordance with one or more embodiments described herein.

FIG. 2 illustrates a circuit diagram 200 of an example, non-limiting system that can facilitate mitigating stray-coupling via multi junction qubits in accordance with one or more embodiments described herein. In particular, FIG. 2 depicts a circuit diagram that corresponds to the physical structures/architectures shown in FIG. 1.

In various embodiments, as shown, the circuit diagram of the multi junction qubit 102 can be considered as including the Josephson junction 104 shunted by a capacitance 204, as further including the Josephson junction 106 shunted by a capacitance 206, and/or as further including both the Josephson junction 104 and the Josephson junction 106 as being shunted by a capacitance 202. In various aspects, the capacitance 204 can be considered as a capacitive interaction that arises between the capacitor pad 108 and the capacitor pad 110. Likewise, the capacitance 206 can be considered as a capacitive interaction that arises between the capacitor pad 110 and the capacitor pad 112. Similarly, the capacitance 202 can be considered as a capacitive interaction that arises between the capacitor pad 108 and the capacitor pad 112. In various instances, the values (e.g., as measured in Farads) of the capacitance 202, the capacitance 204, and/or the capacitance 206 can depend upon the sizes, shapes, dimensions, and/or material compositions of the capacitor pad 108, of the capacitor pad 110, and/or of the capacitor pad 112.

In various aspects, as shown, the circuit diagram of the qubit 114 can be considered as including the Josephson junction 116 shunted by a capacitance 208. In various instances, the capacitance 208 can be considered as a capacitive interaction that arises between the capacitor pad 118 and the capacitor pad 120. In various cases, the value (e.g., as measured in Farads) of the capacitance 208 can depend upon the sizes, shapes, dimensions, and/or material compositions of the capacitor pad 118 and/or of the capacitor pad 120.

In various instances, as shown, there can be a capacitance 210 between the multi-junction qubit 102 and the qubit 114. In various cases, the capacitance 210 can be an equivalent capacitive interaction that arises between the capacitor pad 112 and the capacitor pad 120 due to the direct capacitive coupler 122. More specifically, there can be a first constituent capacitive interaction between the capacitor pad 112 and the direct capacitive coupler 122, and there can be a second constituent capacitive interaction between the capacitor pad 120 and the direct capacitive coupler 122. In various cases, those two constituent capacitive interactions can be considered as combining (e.g., according to the laws of combining capacitors in series) to yield the capacitance 210. In various aspects, the value (e.g., as measured in Farads) of the capacitance 210 can depend upon the sizes, shapes, dimensions, and/or material compositions of the capacitor pad 112, of the capacitor pad 120, and/or of the direct capacitive coupler 122.

In various aspects, as shown, the circuit diagram of the qubit 124 can be considered as including the Josephson junction 126 shunted by a capacitance 212. In various instances, just as above, the capacitance 212 can be considered as a capacitive interaction that arises between the capacitor pad 128 and the capacitor pad 130. So, in various cases, the value (e.g., as measured in Farads) of the capacitance 212 can depend upon the sizes, shapes, dimensions, and/or material compositions of the capacitor pad 128 and/or of the capacitor pad 130.

In various instances, as also shown, there can be a capacitance 214 between the multi junction qubit 102 and the qubit 124. In various cases, the capacitance 214 can be an equivalent capacitive interaction that arises between the capacitor pad 110 and the capacitor pad 128 due to the direct capacitive coupler 132. In particular, there can be a first constituent capacitive interaction between the capacitor pad 110 and the direct capacitive coupler 132, and there can be a second constituent capacitive interaction between the capacitor pad 128 and the direct capacitive coupler 132. In various cases, just like above, those two constituent capacitive interactions can be considered as combining (e.g., according to the laws of combining capacitors in series) to yield the capacitance 214. Again, in various aspects, the value (e.g., as measured in Farads) of the capacitance 214 can depend upon the sizes, shapes, dimensions, and/or material compositions of the capacitor pad 110, of the capacitor pad 128, and/or of the direct capacitive coupler 132.

In various aspects, as further shown, the circuit diagram of the qubit 134 can be considered as including the Josephson junction 136 shunted by a capacitance 216. In various instances, just as above, the capacitance 216 can be considered as a capacitive interaction that arises between the capacitor pad 138 and the capacitor pad 140. Thus, in various cases, the value (e.g., as measured in Farads) of the capacitance 216 can depend upon the sizes, shapes, dimensions, and/or material compositions of the capacitor pad 138 and/or of the capacitor pad 140.

In various instances, as also shown, there can be a capacitance 218 between the multi junction qubit 102 and the qubit 134. In various cases, the capacitance 218 can be an equivalent capacitive interaction that arises between the capacitor pad 108 and the capacitor pad 140 due to the direct capacitive coupler 142. Specifically, there can be a first constituent capacitive interaction between the capacitor pad 108 and the direct capacitive coupler 142, and there can be a second constituent capacitive interaction between the capacitor pad 140 and the direct capacitive coupler 142. In various cases, just like above, those two constituent capacitive interactions can be considered as combining (e.g., according to the laws of combining capacitors in series) to yield the capacitance 218. Once more, in various aspects, the value (e.g., as measured in Farads) of the capacitance 218 can depend upon the sizes, shapes, dimensions, and/or material compositions of the capacitor pad 108, of the capacitor pad 140, and/or of the direct capacitive coupler 142.

Figure 3:
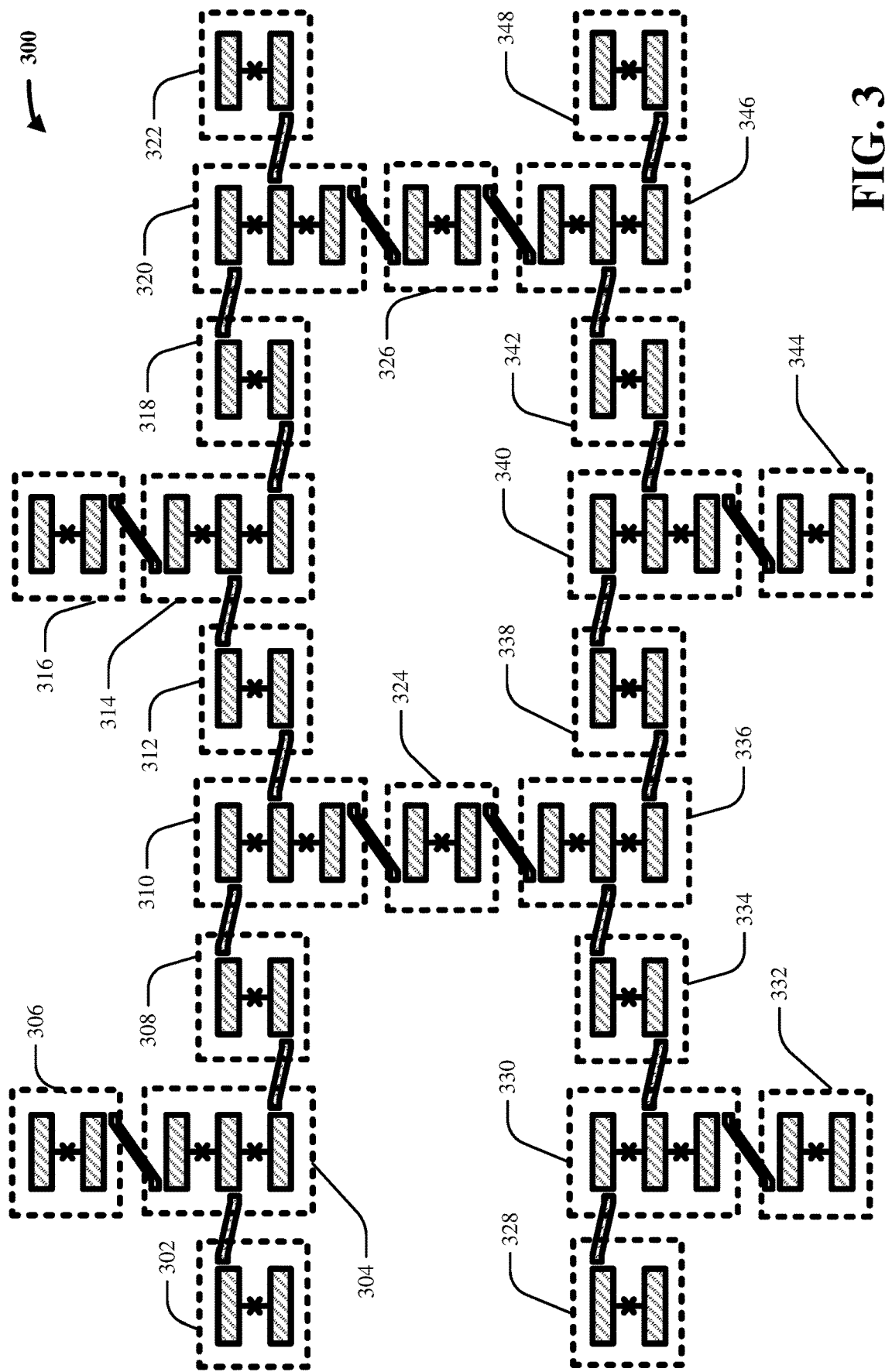
FIG. 3 illustrates a structural diagram of an example, non-limiting qubit lattice that facilitates mitigating stray-coupling via multi junction qubits in accordance with one or more embodiments described herein.

FIG. 3 illustrates a structural diagram of an example, non-limiting qubit lattice 300 that can facilitate mitigating stray-coupling via multi junction qubits in accordance with one or more embodiments described herein. In other words, FIG. 3 shows how the structures/architectures depicted in FIG. 1 can be scaled up to create a qubit lattice with a higher-order coupling topology that does not suffer from excessive stray-coupling.

In various embodiments, as shown, the qubit lattice 300 can include a plurality of qubits: a qubit 302, a qubit 304, a qubit 306, a qubit 308, a qubit 310, a qubit 312, a qubit 314, a qubit 316, a qubit 318, a qubit 320, a qubit 322, a qubit 324, a qubit 326, a qubit 328, a qubit 330, a qubit 332, a qubit 334, a qubit 336, a qubit 338, a qubit 340, a qubit 342, a qubit 344, a qubit 346, and/or a qubit 348.

In various aspects, as shown, some qubits within the qubit lattice 300 can be coupled to two or fewer neighboring qubits, whereas other qubits within the qubit lattice 300 can be coupled to more than two neighboring qubits. For instance, the qubit 302, the qubit 306, the qubit 316, the qubit 322, the qubit 328, the qubit 332, the qubit 344, and/or the qubit 348 can each be coupled (e.g., by a direct and/or indirect capacitive coupler, whether fixed or flux-tunable) to one neighboring qubit. Furthermore, the qubit 308, the qubit 312, the qubit 318, the qubit 324, the qubit 326, the qubit 334, the qubit 338, and/or the qubit 342 can each be coupled to two neighboring qubits. Further still, the qubit 304, the qubit 310, the qubit 314, the qubit 320, the qubit 330, the qubit 336, the qubit 340, and/or the qubit 346 can each be coupled to three neighboring qubits. In various cases, as shown, any qubit within the qubit lattice 300 that is coupled to two or fewer neighbors can be a single-junction transmon. However, in various aspects, as also shown, any qubit within the qubit lattice 300 that is coupled to more than two neighbors can be a multi junction qubit. Indeed, in the non-limiting example of FIG. 3, each qubit in the qubit lattice 300 that is coupled to three neighbors can be a two-junction transmon, instead of a single junction transmon. Accordingly, each of such two-junction transmons can be coupled to three neighbors in the fashion that is depicted in FIG. 1. That is, each of such two-junction transmons can be considered as having three capacitor pads, and the neighbors of each of such two-junction transmons can be respectively coupled to different/separate/unique ones of those three capacitor pads.

For example, the qubit 304 can be a two-junction transmon having three capacitor pads, where a first of such three capacitor pads can be coupled to the qubit 302, where a second of such three capacitor pads can be coupled to the qubit 306, and/or where a third of such three capacitor pads can be coupled to the qubit 308. Accordingly, because none of the qubit 302, the qubit 306, and the qubit 308 can be coupled to the same capacitor pad as each other, stray-coupling and/or cross-talk between the qubit 302, the qubit 306, and the qubit 308 can be considered as mitigated and/or reduced.

As another example, the qubit 310 can be a two-junction transmon having three capacitor pads, where a first of such three capacitor pads can be coupled to the qubit 308, where a second of such three capacitor pads can be coupled to the qubit 324, and/or where a third of such three capacitor pads can be coupled to the qubit 312. Therefore, because none of the qubit 308, the qubit 324, and the qubit 312 can be coupled to the same capacitor pad as each other, stray-coupling and/or cross-talk between the qubit 308, the qubit 324, and the qubit 312 can be considered as mitigated and/or reduced.

As even another example, the qubit 314 can be a two-junction transmon having three capacitor pads, where a first of such three capacitor pads can be coupled to the qubit 312, where a second of such three capacitor pads can be coupled to the qubit 316, and/or where a third of such three capacitor pads can be coupled to the qubit 318. Thus, because none of the qubit 312, the qubit 316, and the qubit 318 can be coupled to the same capacitor pad as each other, stray-coupling and/or cross-talk between the qubit 312, the qubit 316, and the qubit 318 can be considered as mitigated and/or reduced.

As still another example, the qubit 320 can be a two-junction transmon having three capacitor pads, where a first of such three capacitor pads can be coupled to the qubit 318, where a second of such three capacitor pads can be coupled to the qubit 326, and/or where a third of such three capacitor pads can be coupled to the qubit 322. So, because none of the qubit 318, the qubit 326, and the qubit 322 can be coupled to the same capacitor pad as each other, stray-coupling and/or cross-talk between the qubit 318, the qubit 326, and the qubit 322 can be considered as mitigated and/or reduced.

As yet another example, the qubit 330 can be a two-junction transmon having three capacitor pads, where a first of such three capacitor pads can be coupled to the qubit 328, where a second of such three capacitor pads can be coupled to the qubit 332, and/or where a third of such three capacitor pads can be coupled to the qubit 334. So, because none of the qubit 328, the qubit 332, and the qubit 334 can be coupled to the same capacitor pad as each other, stray-coupling and/or cross-talk between the qubit 328, the qubit 332, and the qubit 334 can be considered as mitigated and/or reduced.

As a further example, the qubit 336 can be a two-junction transmon having three capacitor pads, where a first of such three capacitor pads can be coupled to the qubit 334, where a second of such three capacitor pads can be coupled to the qubit 324, and/or where a third of such three capacitor pads can be coupled to the qubit 338. So, because none of the qubit 334, the qubit 324, and the qubit 338 can be coupled to the same capacitor pad as each other, stray-coupling and/or cross-talk between the qubit 334, the qubit 324, and the qubit 338 can be considered as mitigated and/or reduced.

As still a further example, the qubit 340 can be a two-junction transmon having three capacitor pads, where a first of such three capacitor pads can be coupled to the qubit 338, where a second of such three capacitor pads can be coupled to the qubit 344, and/or where a third of such three capacitor pads can be coupled to the qubit 342. So, because none of the qubit 338, the qubit 344, and the qubit 342 can be coupled to the same capacitor pad as each other, stray-coupling and/or cross-talk between the qubit 338, the qubit 344, and the qubit 342 can be considered as mitigated and/or reduced.

As even another example, the qubit 346 can be a two-junction transmon having three capacitor pads, where a first of such three capacitor pads can be coupled to the qubit 342, where a second of such three capacitor pads can be coupled to the qubit 326, and/or where a third of such three capacitor pads can be coupled to the qubit 348. So, because none of the qubit 342, the qubit 326, and the qubit 348 can be coupled to the same capacitor pad as each other, stray-coupling and/or cross-talk between the qubit 342, the qubit 326, and the qubit 348 can be considered as mitigated and/or reduced.

In this way, the qubit lattice 300 can exhibit a heavy-hex tiling layout such that no two qubits within the qubit lattice 300 are coupled to a same capacitor pad as each other. Accordingly, because no two qubits within the qubit lattice 300 can be coupled to a same capacitor pad as each other (e.g., because all of the qubits in the qubit lattice 300 can be coupled to different/separate/distinct capacitor pads), the qubit lattice 300 can be considered as not exhibiting heightened and/or exacerbated stray-coupling, notwithstanding exhibiting a heavy-hex topology. In contrast, such heightened and/or exacerbated stray-coupling would occur in the qubit lattice 300, if each qubit within the qubit lattice 300 that is coupled to three neighbors were a single-junction transmon instead of a two-junction transmon. Therefore, by replacing each qubit within the qubit lattice that is coupled to more than two neighbors with a multi junction qubit, stray-coupling can be reduced.

Although FIG. 3 depicts the qubit lattice 300 as including twenty-four qubits, this is a mere non-limiting example for ease of illustration. In various cases, the qubit lattice 300 can include any suitable number of qubits.

Although FIG. 3 depicts the qubit lattice 300 as having a heavy-hex tiling layout/topology, this is a mere non-limiting example for ease of illustration. In various aspects, the qubit lattice 300 can exhibit any other suitable type of tiling topology/layout as desired. Indeed, any suitable higher-order coupling topology can be obtained without excessive stray-coupling, so long as any qubit to which more than two neighbors are coupled is a multi junction qubit having sufficiently many coupling elements rather than a single-junction transmon.

The herein disclosure has thus far described various embodiments as mainly pertaining to the implementation of two-junction transmon qubits to mitigate stray-coupling in an array/lattice of single-junction transmon qubits. However, this is a mere non-limiting example for ease of illustration/explanation. In various aspects, the teachings described herein can be applied and/or otherwise extrapolated to any suitable qubits within any suitable qubit lattice/array.

For example, in general, a multi junction qubit can be considered as having a plurality of Josephson junctions that are arranged in series with and/or in parallel with a plurality of coupling elements. In various aspects, a coupling element can be any suitable circuit structure (e.g., any suitable physical piece of the multi junction qubit) to which neighboring qubits can be operatively coupled. As mainly described above, a non-limiting example of such a coupling element can be a capacitor pad of the multi junction qubit. This is because a neighboring qubit can capacitively interact, either directly and/or indirectly, in fixed or flux-tunable fashion, with a capacitor pad of the multi junction qubit. Thus, a capacitor pad can be considered as a non-limiting type of coupling element. However, another non-limiting example of such a coupling element can be an inductive loop of the multi junction qubit. This is because a multi junction qubit can be fabricated to have inductive loops in addition to capacitor pads, and further because a neighboring qubit can inductively interact, either directly and/or indirectly, in fixed or flux-tunable fashion, with an inductive loop of the multi junction qubit. Thus, an inductive loop can also be considered as a non-limiting type of coupling element. Embodiments pertaining to such inductive loops are described more with respect to FIGS. 4-5

Figure 4:
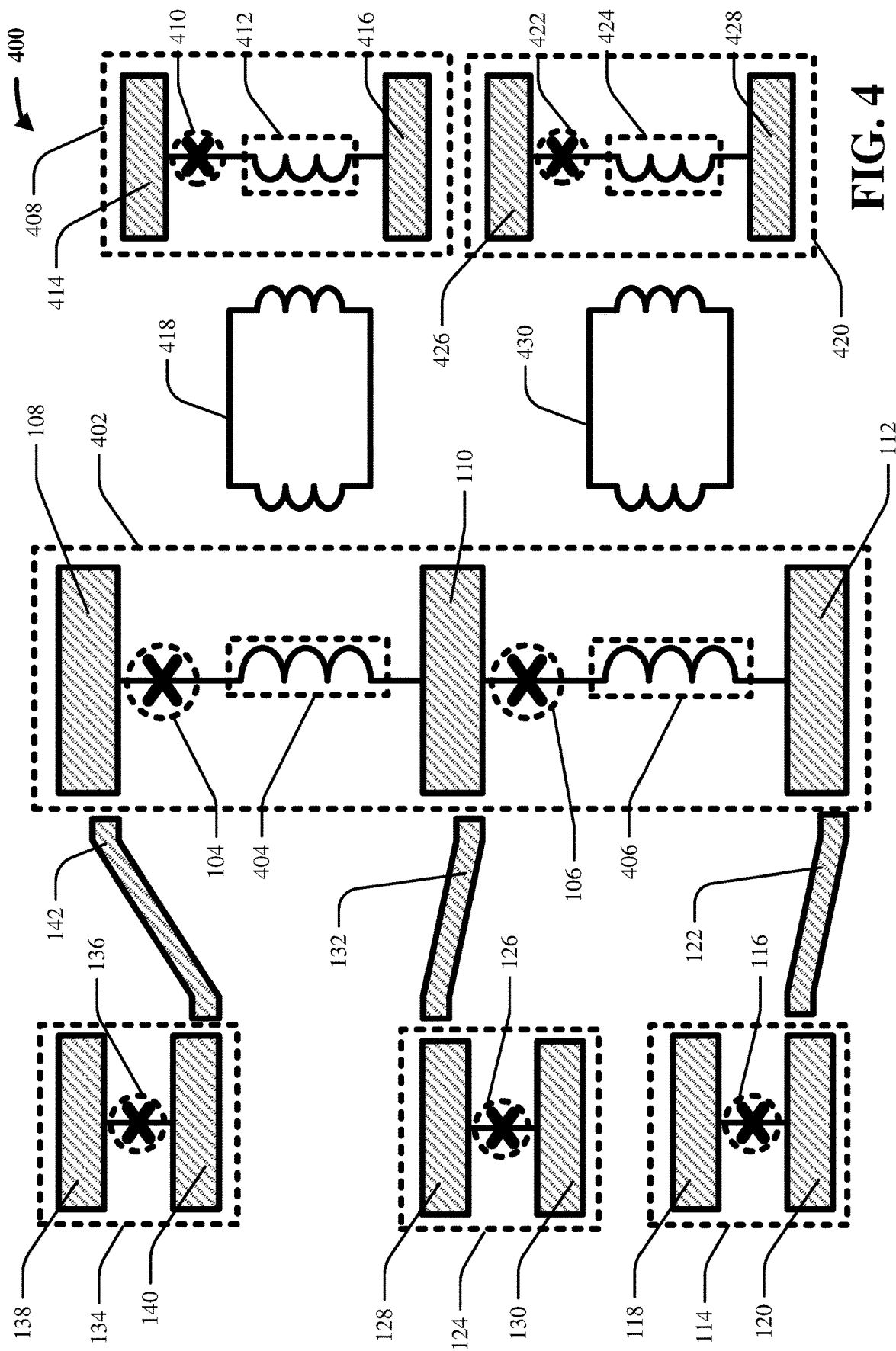
FIG. 4 illustrates a structural diagram of an example, non-limiting system including both capacitive and inductive couplers that facilitates mitigating stray-coupling via multi junction qubits in accordance with one or more embodiments described herein.

FIG. 4 illustrates a structural diagram of an example, non-limiting system 400 including both capacitive and inductive couplers that can facilitate mitigating stray-coupling via multi junction qubits in accordance with one or more embodiments described herein. In various embodiments, the Josephson junction 104, the Josephson junction 106, the capacitor pad 108, the capacitor pad 110, the capacitor pad 112, the qubit 114, the direct capacitive coupler 122, the qubit 124, the direct capacitive coupler 132, the qubit 134, and/or the direct capacitive coupler 142 can be as described above.

In various aspects, as shown, there can be an inductive loop 404 coupled in series with and/or between the capacitor pad 108, the Josephson junction 104, and the capacitor pad 110. In various instances, the inductive loop 404 can be any suitable superconducting coil and/or meandering wire that exhibits any suitable inductance value (e.g., as measured in Henry). In various cases, the inductive loop 404 can be manufactured by any suitable microfabrication and/or nanofabrication techniques (e.g., photolithography, deposition, etching, double-angle evaporation) so as to have any suitable size, shape, dimensions, and/or material composition. Likewise, in various instances, there can an inductive loop 406 coupled in series with and/or between the capacitor pad 110, the Josephson junction 106, and the capacitor pad 112. In various cases, the inductive loop 406 can be any suitable superconducting coil and/or meandering wire that exhibits any suitable inductance value (e.g., as measured in Henry). Just as above, in various aspects, the inductive loop 406 can be manufactured by any suitable microfabrication and/or nanofabrication techniques so as to have any suitable size, shape, dimensions, and/or material composition.

Although FIG. 4 depicts the inductive loop 404 and the inductive loop 406 as being identical, this is a mere non-limiting example for ease of illustration. In various aspects, the inductive loop 404 and/or the inductive loop 406 can have the same and/or different sizes, shapes, spatial dimensions, and/or material compositions as each other.

In any case, the capacitor pad 108, the Josephson junction 104, the inductive loop 404, the capacitor pad 110, the Josephson junction 106, the inductive loop 406, and the capacitor pad 112 can collectively be considered as forming a multi junction qubit 402.

In various embodiments, as shown, there can be a qubit 408. In various aspects, the qubit 408 can comprise a Josephson junction 410, an inductive loop 412, a capacitor pad 414, and/or a capacitor pad 416. In various instances, as shown, the Josephson junction 410 can be coupled to the capacitor pad 414, to the inductive loop 412, and to the capacitor pad 416, such that the capacitor pad 414, the Josephson junction 410, the inductive loop 412, and the capacitor pad 416 can be considered as all being in series with each other. Thus, in various cases, the capacitor pad 414 and the capacitor pad 416 can collectively be considered as forming a capacitance that shunts the Josephson junction 410, whereas the inductive loop 412 can be considered as forming an inductance that is in series with the Josephson junction 410.

In various aspects, any suitable microfabrication and/or nanofabrication techniques can be implemented to manufacture the capacitor pad 414, the Josephson junction 410, the inductive loop 412, and/or the capacitor pad 416.

Although FIG. 4 depicts the Josephson junction 410 as being identical to the Josephson junctions of the multi junction qubit 402, to the Josephson junction of the qubit 114, to the Josephson junction of the qubit 124, and/or to the Josephson junction of the qubit 134, this is a mere non-limiting example for ease of illustration and/or explanation. The Josephson junction 410 can, in various aspects, have the same and/or different sizes, shapes, spatial dimensions, and/or material compositions as the Josephson junctions of the multi junction qubit 402, as the Josephson junction of the qubit 114, as the Josephson junction of the qubit 124, and/or as the Josephson junction of the qubit 134.

Likewise, although FIG. 4 depicts the capacitor pad 414 and the capacitor pad 416 as being identical to each other, as being identical to the capacitor pads of the multi junction qubit 402, as being identical to the capacitor pads of the qubit 114, as being identical to the capacitor pads of the qubit 124, and/or as being identical to the capacitor pads of the qubit 134, this is a mere non-limiting example for ease of illustration. Indeed, in various aspects, the capacitor pad 414 and/or the capacitor pad 416 can have the same and/or different sizes, shapes, spatial dimensions, and/or material compositions as each other, as the capacitor pads of the multi junction qubit 402, as the capacitor pads of the qubit 114, as the capacitor pads of the qubit 124, and/or as the capacitor pads of the qubit 134.

Likewise still, although FIG. 4 depicts the inductive loop 412 as being identical to the inductive loop 404 and/or to the inductive loop 406, this is a mere non-limiting example for ease of illustration. In various cases, the inductive loop 412 can have the same and/or different sizes, shapes, spatial dimensions, and/or material compositions as the inductive loop 404 and/or as the inductive loop 406.

In various embodiments, as shown, the multi junction qubit 402 can be coupled to the qubit 408 by a direct inductive coupler 418. In particular, the direct inductive coupler 418 can be any suitable wire, cable, and/or circuit structure that can transmit inductive interactions between the inductive loop 404 of the multi junction qubit 402 and the inductive loop 412 of the qubit 408. Thus, the direct inductive coupler 418 can be considered as inductively coupling the inductive loop 404 to the inductive loop 412.

In various cases, the direct inductive coupler 418 can be manufactured via any suitable microfabrication and/or nanofabrication techniques. In various instances, the direct inductive coupler 418 can have any suitable size, shape, spatial dimensions, and/or material composition (e.g., can be made up of any suitable superconducting materials) as desired.

Although FIG. 4 depicts the inductive loop 404 as being inductively coupled to the inductive loop 412 by the direct inductive coupler 418, this is a mere non-limiting example for ease of illustration and/or explanation. In various aspects, any other suitable inductive coupler (e.g., an indirect inductive coupler), whether fixed or flux-tunable, can be implemented in place of and/or in addition to the direct inductive coupler 418.

In various embodiments, as shown, there can be a qubit 420. In various aspects, the qubit 420 can comprise a Josephson junction 422, an inductive loop 424, a capacitor pad 426, and/or a capacitor pad 428. In various instances, as shown, the Josephson junction 422 can be coupled to the capacitor pad 426, to the inductive loop 424, and to the capacitor pad 428, such that the capacitor pad 426, the Josephson junction 422, the inductive loop 424, and the capacitor pad 428 can be considered as all being in series with each other. Thus, in various cases, the capacitor pad 426 and the capacitor pad 428 can collectively be considered as forming a capacitance that shunts the Josephson junction 422, whereas the inductive loop 424 can be considered as forming an inductance that is in series with the Josephson junction 422.

Just as above, in various cases, any suitable microfabrication and/or nanofabrication techniques can be implemented to manufacture the capacitor pad 426, the Josephson junction 422, the inductive loop 424, and/or the capacitor pad 428.

Although FIG. 4 depicts the Josephson junction 422 as being identical to the Josephson junctions of the multi junction qubit 402, to the Josephson junction of the qubit 114, to the Josephson junction of the qubit 124, to the Josephson junction of the qubit 134, and/or to the Josephson junction of the qubit 408, this is a mere non-limiting example for ease of illustration and/or explanation. In various aspects, the Josephson junction 422 can, in various aspects, have the same and/or different sizes, shapes, spatial dimensions, and/or material compositions as the Josephson junctions of the multi junction qubit 402, as the Josephson junction of the qubit 114, as the Josephson junction of the qubit 124, as the Josephson junction of the qubit 134, and/or as the Josephson junction of the qubit 408.

Likewise, although FIG. 4 depicts the capacitor pad 426 and the capacitor pad 428 as being identical to each other, as being identical to the capacitor pads of the multi junction qubit 402, as being identical to the capacitor pads of the qubit 114, as being identical to the capacitor pads of the qubit 124, as being identical to the capacitor pads of the qubit 134, and/or as being identical to the capacitor pads of the qubit 408, this is a mere non-limiting example for ease of illustration. Indeed, in various instances, the capacitor pad 426 and/or the capacitor pad 428 can have the same and/or different sizes, shapes, spatial dimensions, and/or material compositions as each other, as the capacitor pads of the multi junction qubit 402, as the capacitor pads of the qubit 114, as the capacitor pads of the qubit 124, as the capacitor pads of the qubit 134, and/or as the capacitor pads of the qubit 408.

Likewise still, although FIG. 4 depicts the inductive loop 424 as being identical to the inductive loop 404, to the inductive loop 406, and/or to the inductive loop 412, this is a mere non-limiting example for ease of illustration. In various cases, the inductive loop 424 can have the same and/or different sizes, shapes, spatial dimensions, and/or material compositions as the inductive loop 404, as the inductive loop 406, and/or as the inductive loop 412.

In various embodiments, as shown, the multi junction qubit 402 can be coupled to the qubit 420 by a direct inductive coupler 430. In particular, the direct inductive coupler 430 can be any suitable wire, cable, and/or circuit structure that can transmit inductive interactions between the inductive loop 406 of the multi junction qubit 402 and the inductive loop 424 of the qubit 420. Thus, the direct inductive coupler 430 can be considered as inductively coupling the inductive loop 406 to the inductive loop 424.

As above, in various cases, the direct inductive coupler 430 can be manufactured via any suitable microfabrication and/or nanofabrication techniques. In various aspects, the direct inductive coupler 430 can have any suitable size, shape, spatial dimensions, and/or material composition (e.g., can be made up of any suitable superconducting materials) as desired (e.g., can have different sizes, shapes, dimensions, and/or compositions than the direct inductive coupler 418).

Although FIG. 4 depicts the inductive loop 406 as being inductively coupled to the inductive loop 424 by the direct inductive coupler 430, this is a mere non-limiting example for ease of illustration and/or explanation. In various aspects, any other suitable inductive coupler (e.g., an indirect inductive coupler), whether fixed or flux-tunable, can be implemented in place of and/or in addition to the direct inductive coupler 430.

In any case, as shown, the multi junction qubit 402 can be considered as having five coupling elements (e.g., 108, 110, 112, 404, and 406) via which the multi junction qubit 402 can be coupled to five neighboring qubits (e.g., 114, 124, 134, 408, and 420). In other words, the multi junction qubit 402 can be considered as having one coupling element per neighboring qubit to which it is coupled. In this way, no two neighboring qubits can be coupled to a same coupling element, which can help to reduce stray-coupling (e.g., which can help to reduce spectator cross-talk).

For example, the qubit 114 can be coupled to the capacitor pad 112 and can be coupled to none of the capacitor pad 110, the capacitor pad 108, the inductive loop 404, and the inductive loop 406. Moreover, the qubit 124 can be coupled to the capacitor pad 110 and can be coupled to none of the capacitor pad 112, the capacitor pad 108, the inductive loop 404, and the inductive loop 406. Furthermore, the qubit 134 can be coupled to the capacitor pad 108 and can be coupled to none of the capacitor pad 110, the capacitor pad 112, the inductive loop 404, and the inductive loop 406. Further still, the qubit 408 can be coupled to the inductive loop 404 and can be coupled to none of the capacitor pad 112, the capacitor pad 110, the capacitor pad 108, and the inductive loop 406. Moreover, the qubit 420 can be coupled to the inductive loop 406 and can be coupled to none of the capacitor pad 112, the capacitor pad 110, the capacitor pad 108, and the inductive loop 404. Accordingly, each of the qubit 114, the qubit 124, the qubit 134, the qubit 408, and the qubit 420 can be considered as being coupled to its own corresponding/unique coupling element, where such coupling element can be a capacitor pad of the multi junction qubit 402 or an inductive loop of the multi junction qubit 402. In any case, the result can be less, reduced, and/or mitigated cross-talk between the qubit 114, the qubit 124, the qubit 134, the qubit 408, and/or the qubit 420.

Although FIG. 4 shows the multi junction qubit 402 as being coupled to five neighbors (e.g., 114, 124, 134, 408, and 420) via three capacitor pads (e.g., 108, 110, and 112) and via two inductive loops (e.g., 404 and 406), this is a mere non-limiting example for ease of explanation and/or illustration. More generally, it can be desired to capacitively couple the multi junction qubit 402 to w neighbors for any suitable positive integer w, and it can further be desired to inductively couple the multi junction qubit 402 to x neighbors for any suitable positive integer x. In such case, the multi junction qubit 402 can be configured/structured to have at least w capacitor pads and at least x inductive loops. Accordingly, this can help to ensure that each of the w neighbors to which the multi junction qubit 402 is to be capacitively coupled and that each of the x neighbors to which the multi junction qubit 402 is to be inductively coupled can have its own corresponding/unique coupling element. In other words, this can help to ensure that no two neighbors can be coupled to same coupling element as each other.

Although not explicitly shown in the figures, the architectures/structures shown in FIG. 4 can, in various aspects, be scaled up to create any suitable higher-order coupling topology/layout/tiling as desired.

Figure 5:
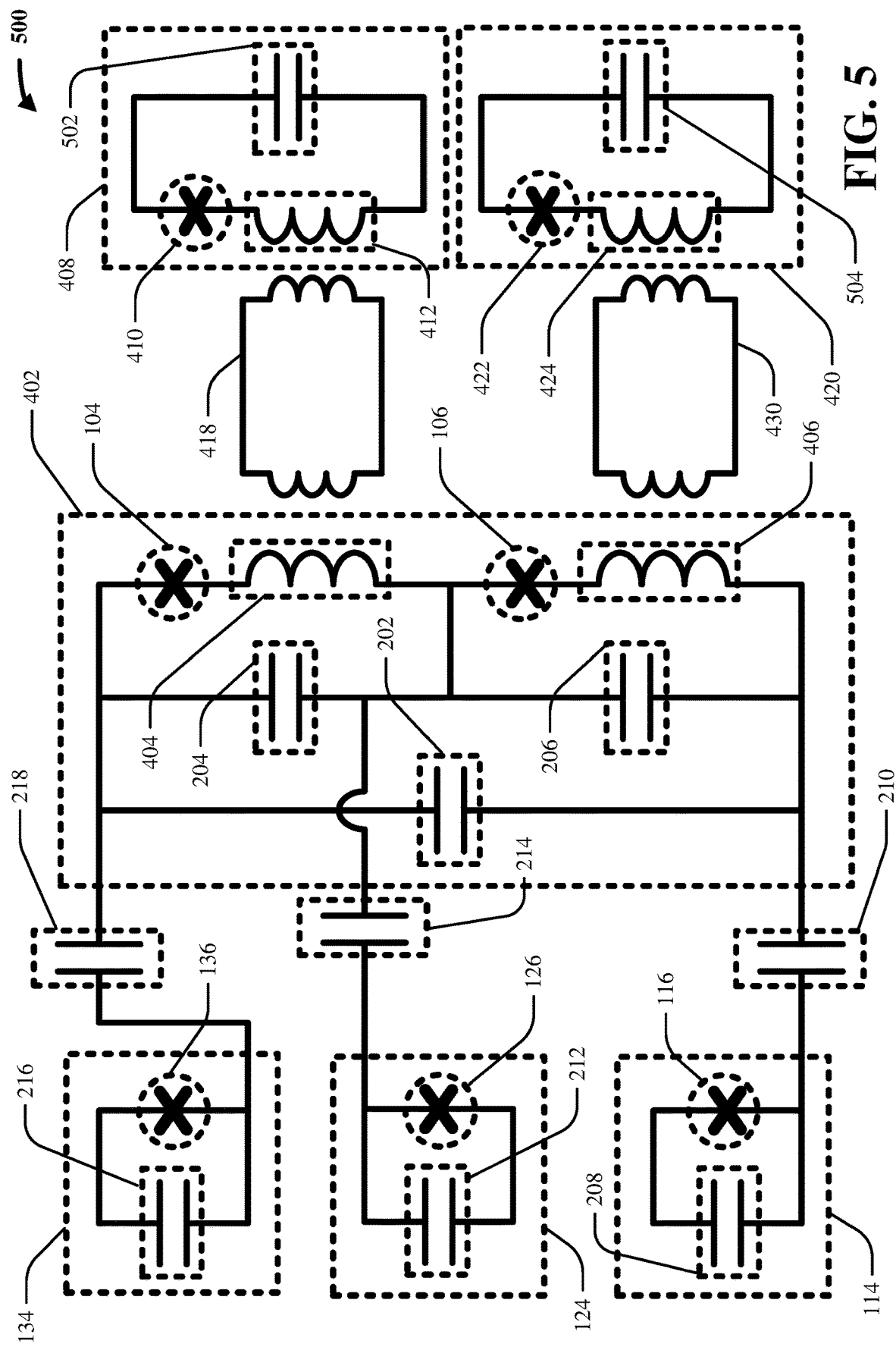
FIG. 5 illustrates a circuit diagram of an example, non-limiting system including both capacitive and inductive couplers that facilitates mitigating stray-coupling via multi-junction qubits in accordance with one or more embodiments described herein.

FIG. 5 illustrates a circuit diagram 500 of an example, non-limiting system including both capacitive and inductive couplers that can facilitate mitigating stray-coupling via multi junction qubits in accordance with one or more embodiments described herein. In particular, FIG. 5 depicts a circuit diagram that corresponds to the physical structures/architectures shown in FIG. 4. In various cases, the Josephson junction 104, the Josephson junction 106, the inductive loop 404, the inductive loop 406, the capacitance 202, the capacitance 204, the capacitance 206, the Josephson junction 116, the capacitance 208, the capacitance 210, the Josephson junction 126, the capacitance 212, the capacitance 214, the Josephson junction 136, the capacitance 216, the capacitance 218, the Josephson junction 410, the inductive loop 412, the direct inductive coupler 418, the Josephson junction 422, the inductive loop 424, and the direct inductive coupler 430 can be as described above.

In various embodiments, as shown, the circuit diagram of the multi junction qubit 402 can be considered as including the Josephson junction 104 shunted by the capacitance 204, as further including the Josephson junction 106 shunted by the capacitance 206, and/or as further including both the Josephson junction 104 and the Josephson junction 106 as being shunted by the capacitance 202. As also shown, the circuit diagram of the multi junction qubit 402 can further include the inductive loop 404 being in series with the Josephson junction 104, and can even further include the inductive loop 406 being in series with the Josephson junction 106.

In various aspects, as shown, the circuit diagram of the qubit 114, the circuit diagram of the qubit 124, and the circuit diagram of the qubit 134 can be as described above.

In various aspects, as further shown, the circuit diagram of the qubit 408 can be considered as including the Josephson junction 410 in series with the inductive loop 412 and shunted by a capacitance 502. In various instances, the capacitance 502 can be considered as a capacitive interaction that arises between the capacitor pad 414 and the capacitor pad 416. Thus, in various cases, the value (e.g., as measured in Farads) of the capacitance 502 can depend upon the sizes, shapes, dimensions, and/or material compositions of the capacitor pad 414 and/or of the capacitor pad 416. Just as explained above, the direct inductive coupler 418 can inductively couple the inductive loop 404 to the inductive loop 412.

In various instances, as also shown, the circuit diagram of the qubit 420 can be considered as including the Josephson junction 422 in series with the inductive loop 424 and shunted by a capacitance 504. In various instances, the capacitance 504 can be considered as a capacitive interaction that arises between the capacitor pad 426 and the capacitor pad 428. Thus, in various aspects, the value (e.g., as measured in Farads) of the capacitance 504 can depend upon the sizes, shapes, dimensions, and/or material compositions of the capacitor pad 426 and/or of the capacitor pad 428. Again, just as explained above, the direct inductive coupler 430 can inductively couple the inductive loop 406 to the inductive loop 424.

Figure 6:
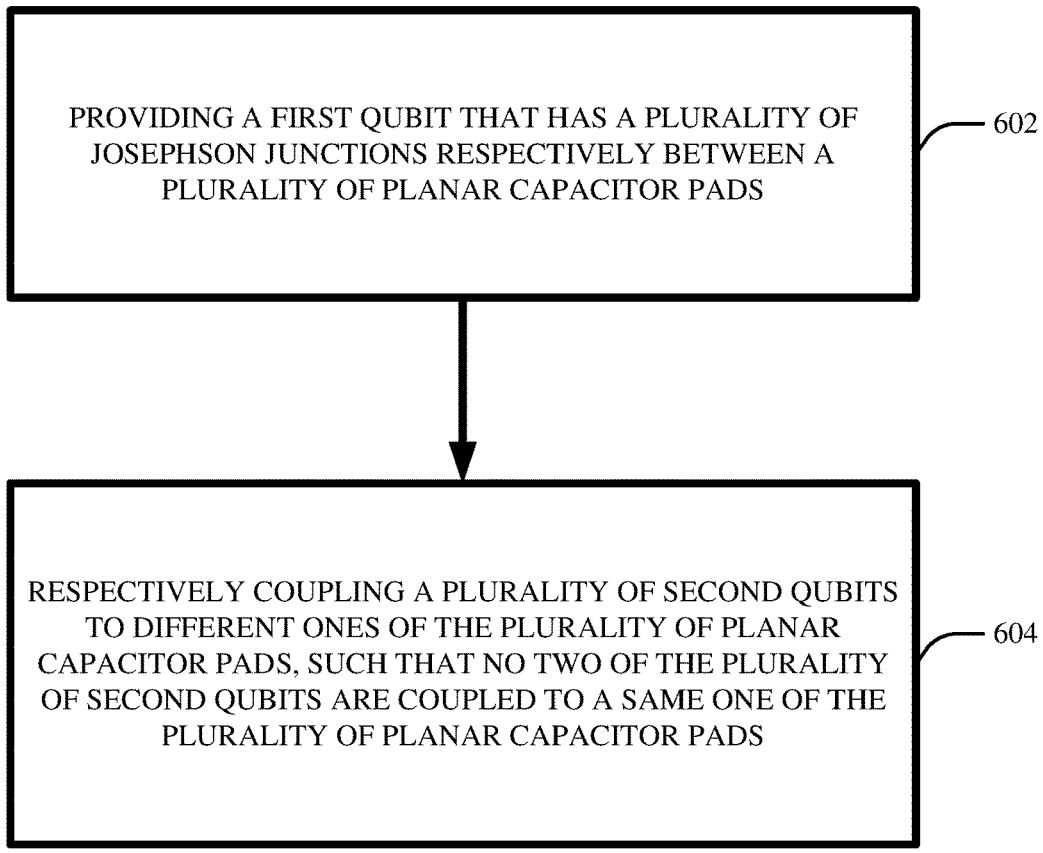
FIGS. 6-7 illustrate flow diagrams of example, non-limiting methods that facilitate mitigating stray-coupling via multi junction qubits in accordance with one or more embodiments described herein.
Figure 7:
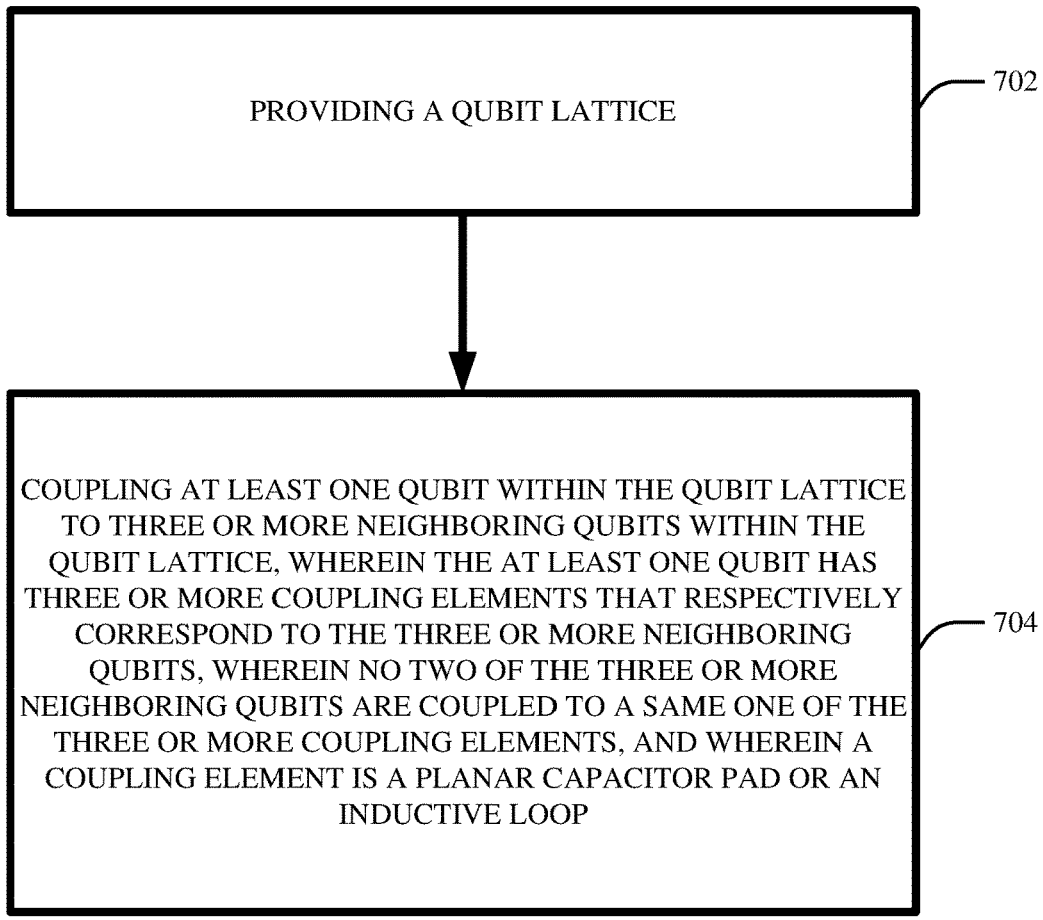

FIGS. 6-7 illustrate flow diagrams of example, non-limiting methods 600 and 700 that can facilitate mitigating stray-coupling via multi junction qubits in accordance with one or more embodiments described herein.

First, consider the method 600 shown in FIG. 6. In various embodiments, act 602 can include providing a first qubit (e.g., 102 and/or 402) that has a plurality of Josephson junctions (e.g., 104 and 106) respectively between a plurality of capacitor pads (e.g., 108, 110, and 112).

In various aspects, act 604 can include respectively coupling a plurality of second qubits (e.g., 114, 124, and 134) to different ones of the plurality of capacitor pads, such that no two of the plurality of second qubits are coupled to a same one of the plurality of capacitor pads (e.g., as shown with respect to FIG. 1 and/or FIG. 4).

Although not explicitly shown in FIG. 6, a plurality of inductive loops (e.g., 404 and 406) can be respectively between the plurality of capacitor pads, and/or the method 600 can further comprise: respectively coupling a plurality of third qubits (e.g., 408 and 420) to different ones of the plurality of inductive loops (e.g., as shown in FIG. 4), such that no two of the plurality of third qubits can be coupled to a same one of the plurality of inductive loops.

Although not explicitly shown in FIG. 6, the first qubit can include a first Josephson junction (e.g., 104) between a first capacitor pad (e.g., 108) and a second capacitor pad (e.g., 110), and/or the first qubit further can further include a second Josephson junction (e.g., 106) between the second capacitor pad and a third capacitor pad (e.g., 112). In various aspects, the plurality of second qubits can include a first transmon qubit (e.g., 134) that is coupled to the first capacitor pad and that is coupled to neither the second capacitor pad nor the third capacitor pad, a second transmon qubit (e.g., 124) that is coupled to the second capacitor pad and that is coupled to neither the first capacitor pad nor the third capacitor pad, and/or a third transmon qubit (e.g., 114) that is coupled to the third capacitor pad and that is coupled to neither the first capacitor pad nor the second capacitor pad (e.g., as shown in FIG. 1 and/or FIG. 4).

Now, consider the method 700 of FIG. 7. In various embodiments, act 702 can include providing a qubit lattice (e.g., 300).

In various aspects, act 704 can include coupling at least one qubit (e.g., 102 and/or 402) within the qubit lattice to three or more neighboring qubits (e.g., 114, 124, 134, 408, and/or 420) within the qubit lattice. In various instances, the at least one qubit can have three or more coupling elements (e.g., 108, 110, 112, 404, and/or 406) that respectively correspond to the three or more neighboring qubits. Moreover, in various cases, no two of the three or more neighboring qubits can be coupled to a same one of the three or more coupling elements (e.g., as shown in FIG. 1 and FIG. 4). Further still, in various aspects, a coupling element can be a capacitor pad and/or an inductive loop.

Although not explicitly shown in FIG. 7, the at least one qubit can be coupled to three neighboring qubits (e.g., 114, 124, and 134), the at least one qubit can have two Josephson junctions (e.g., 104 and 106) in series between three capacitor pads (e.g., 108, 110, and 112), and the three neighboring qubits can be respectively coupled to different ones of the three capacitor pads.

Although not explicitly shown in FIG. 7, the at least one qubit can be coupled to five neighboring qubits (e.g., 114, 124, 134, 408, and 420), the at least one qubit can have two Josephson junctions (e.g., 104 and 106) in series between three capacitor pads (e.g., 108, 110, and 112) and two inductive loops (e.g., 404 and 406), and/or the five neighboring qubits can be respectively coupled to different ones of the three capacitor pads and the two inductive loops.

Accordingly, various embodiments described herein can be considered leveraging multi junction qubits to mitigate stray-coupling. As explained above, the present inventors realized that existing techniques can cause excessive stray-coupling, due to the fact that such existing techniques require two or more neighbors to be coupled to a same coupling element (e.g., to a same capacitor pad, and/or to a same inductive loop) as each other. Accordingly, the present inventors realized that such excessive stray-coupling can be ameliorated, whenever it is desired to couple three or more neighbors to a given qubit, by configuring/structuring that given qubit as a multi junction qubit. After all, a multi junction qubit can have more coupling elements than a single-junction qubit. Thus, implementation of a multi junction qubit can help to ensure that each of the three or more neighbors is coupled to its own, corresponding, unique coupling element, thereby reducing spectator cross-talk. Because various embodiments described herein can address the significant technical problem of stray-coupling, such embodiments certainly constitute a concrete and tangible technical solution to a technical problem.

Although the herein disclosure has mainly described various embodiments as pertaining to direct/indirect capacitive/inductive couplers, this is a mere non-limiting example for purposes of explanation. In various cases, the teachings described herein can be implemented with any suitable quantum couplers as desired (e.g., flux-tunable couplers, mode-selective couplers).

The herein disclosure describes non-limiting examples of various embodiments of the subject innovation. For ease of description and/or explanation, various portions of the herein disclosure utilize the term "each" when discussing various embodiments of the subject innovation. Such usages of the term "each" are non-limiting examples. In other words, when the herein disclosure provides a description that is applied to "each" of some particular object and/or component, it should be understood that this is a non-limiting example of various embodiments of the subject innovation, and it should be further understood that, in various other embodiments of the subject innovation, it can be the case that such description applies to fewer than "each" of that particular object and/or component.

The flowcharts and structures in the Figures illustrate the architecture, functionality, and operation of possible implementations of systems, methods, and/or computer program products according to various embodiments described herein. In this regard, each block in the flowcharts can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the flowchart illustrations, and combinations of blocks in the flowchart illustrations, can be implemented by special purpose hardware-based systems that perform the specified functions or acts or carry out combinations of special purpose hardware and computer instructions.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a first qubit having a plurality of Josephson junctions respectively between a plurality of capacitor pads; and
   a plurality of second qubits respectively coupled to different ones of the plurality of capacitor pads, wherein no two of the plurality of second qubits are coupled to a same one of the plurality of capacitor pads.

2. The device of claim 1, further comprising:
   a plurality of inductive loops respectively between the plurality of capacitor pads; and
   a plurality of third qubits respectively coupled to different ones of the plurality of inductive loops.

3. The device of claim 2, wherein no two of the plurality of third qubits are coupled to a same one of the plurality of inductive loops.

4. The device of claim 1, wherein the first qubit includes a first Josephson junction between a first capacitor pad and a second capacitor pad, and wherein the first qubit further includes a second Josephson junction between the second capacitor pad and a third capacitor pad.

5. The device of claim 4, wherein the plurality of second qubits includes a first transmon qubit that is coupled to the first capacitor pad and that is coupled to neither the second capacitor pad nor the third capacitor pad, a second transmon qubit that is coupled to the second capacitor pad and that is coupled to neither the first capacitor pad nor the third capacitor pad, and a third transmon qubit that is coupled to the third capacitor pad and that is coupled to neither the first capacitor pad nor the second capacitor pad.

6. The device of claim 1, wherein the plurality of second qubits are respectively coupled to the different ones of the plurality of capacitor pads by flux-tunable couplers.

7. The device of claim 1, wherein different ones of the plurality of Josephson junctions are differently sized.

8. A method, comprising:
   providing a first qubit that has a plurality of Josephson junctions respectively between a plurality of capacitor pads; and
   respectively coupling a plurality of second qubits to different ones of the plurality of capacitor pads, wherein the plurality of second qubits are respectively coupled to the different ones of the plurality of capacitor pads by flux-tunable couplers.

9. The method of claim 8, wherein no two of the plurality of second qubits are coupled to a same one of the plurality of capacitor pads.

10. The method of claim 9, wherein a plurality of inductive loops are respectively between the plurality of capacitor pads, and further comprising:
    respectively coupling a plurality of third qubits to different ones of the plurality of inductive loops.

11. The method of claim 10, wherein no two of the plurality of third qubits are coupled to a same one of the plurality of inductive loops.

12. The method of claim 8, wherein the first qubit includes a first Josephson junction between a first capacitor pad and a second capacitor pad, and wherein the first qubit further includes a second Josephson junction between the second capacitor pad and a third capacitor pad.

13. The method of claim 12, wherein the plurality of second qubits includes a first transmon qubit that is coupled to the first capacitor pad and that is coupled to neither the second capacitor pad nor the third capacitor pad, a second transmon qubit that is coupled to the second capacitor pad and that is coupled to neither the first capacitor pad nor the third capacitor pad, and a third transmon qubit that is coupled to the third capacitor pad and that is coupled to neither the first capacitor pad nor the second capacitor pad.

14. The method of claim 8, wherein different ones of the plurality of Josephson junctions are differently sized.

15. A system, comprising:

a qubit lattice; and at least one qubit within the qubit lattice that is coupled to three or more neighboring qubits within the qubit lattice, wherein the at least one qubit has three or more coupling elements that respectively correspond to the three or more neighboring qubits, wherein no two of the three or more neighboring qubits are coupled to a same one of the three or more coupling elements, and wherein a coupling element is a capacitor pad or an inductive loop.

16. The system of claim 15, wherein the at least one qubit is coupled to three neighboring qubits, wherein the at least one qubit has two Josephson junctions in series between three capacitor pads, and wherein the three neighboring qubits are respectively coupled to different ones of the three capacitor pads.

17. The system of claim 16, wherein the three neighboring qubits are respectively coupled to the different ones of the three capacitor pads by flux-tunable couplers.

18. The system of claim 15, wherein the at least one qubit is coupled to five neighboring qubits, wherein the at least one qubit has two Josephson junctions in series between three capacitor pads and two inductive loops, and wherein the five neighboring qubits are respectively coupled to different ones of the three capacitor pads and the two inductive loops.

19. The system of claim 18, wherein the five neighboring qubits are respectively coupled to the different ones of the three capacitor pads and the two inductive loops by flux-tunable couplers.

20. The system of claim 15, wherein the qubit lattice exhibits a heavy-hex tiling layout.

* * * * *